(12) United States Patent
Yamazaki et al.

(10) Patent No.: US 12,118,467 B2
(45) Date of Patent: *Oct. 15, 2024

(54) DATA PROCESSING METHOD, IMAGE DISPLAY METHOD, DATA PROCESSING DEVICE, AND IMAGE DISPLAY DEVICE

(71) Applicant: SEMICONDUCTOR ENERGY LABORATORY CO., LTD., Atsugi (JP)

(72) Inventors: Shunpei Yamazaki, Tokyo (JP); Daisuke Kubota, Kanagawa (JP); Yoshiaki Oikawa, Kanagawa (JP); Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/223,081

(22) Filed: Jul. 18, 2023

(65) Prior Publication Data

US 2023/0368022 A1    Nov. 16, 2023

Related U.S. Application Data

(63) Continuation of application No. 17/251,448, filed as application No. PCT/IB2019/054895 on Jun. 12, 2019, now Pat. No. 11,755,905.

(30) Foreign Application Priority Data

Jun. 22, 2018  (JP) ................................. 2018-118485

(51) Int. Cl.
*G06N 3/08* (2023.01)
*G06N 5/04* (2023.01)
(Continued)

(52) U.S. Cl.
CPC ................. *G06N 3/08* (2013.01); *G06N 5/04* (2013.01); *G06V 10/70* (2022.01); *G06V 10/82* (2022.01);
(Continued)

(58) Field of Classification Search
None
See application file for complete search history.

(56) References Cited

U.S. PATENT DOCUMENTS 9,331,100 B2    5/2016  Yamazaki
9,942,483 B2    4/2018  Masuoka et al.
(Continued)

FOREIGN PATENT DOCUMENTS

CN    105493494 A    4/2016
CN    107025423 A    8/2017
(Continued)

OTHER PUBLICATIONS

International Search Report (Application No. PCT/IB2019/054895) Dated Sep. 24, 2019.
(Continued)

*Primary Examiner* — Soo Shin
(74) *Attorney, Agent, or Firm* — Fish & Richardson P.C.

(57) ABSTRACT

A reduction in concentration due to a change in an emotion is inhibited. A change in an emotion of the human is suitably reduced. Part (in particular, an eye or an eye and its vicinity) or the whole of a user's face is detected, a feature of the user's face is extracted from data on the detected part or whole of the face, and an emotion of the user is estimated from the extracted feature of the face. In the case where the estimated emotion is an emotion that might reduce concentration, for example, a stimulus is applied to the sense of
(Continued)

sight, the sense of hearing, the sense of touch, the sense of smell, or the like of the user to recover the concentration of the user.

4 Claims, 19 Drawing Sheets

(51) Int. Cl.
  *G06V 10/70* (2022.01)
  *G06V 10/82* (2022.01)
  *G06V 20/59* (2022.01)
  *G06V 40/16* (2022.01)

(52) U.S. Cl.
  CPC .......... *G06V 20/597* (2022.01); *G06V 40/171* (2022.01); *G06V 40/176* (2022.01)

(56) References Cited

U.S. PATENT DOCUMENTS

| | | | |
|---|---|---|---|
| 10,255,487 | B2 | 4/2019 | Yamaya et al. |
| 11,194,405 | B2 | 12/2021 | Shikii et al. |
| 11,657,640 | B2* | 5/2023 | Lu .................. H10K 59/65 382/124 |
| 11,755,905 | B2* | 9/2023 | Yamazaki .............. G06V 10/70 382/195 |
| 2002/0066967 | A1* | 6/2002 | Bartsch .................. A61L 9/122 261/DIG. 89 |
| 2009/0003709 | A1 | 1/2009 | Kaneda et al. |
| 2009/0186470 | A1 | 7/2009 | Takahashi et al. |
| 2009/0316862 | A1 | 12/2009 | Sugimoto et al. |
| 2014/0091301 | A1* | 4/2014 | Yamazaki ........... H01L 27/1225 257/43 |
| 2015/0258560 | A1* | 9/2015 | Ashby .................. A61L 9/035 239/70 |
| 2016/0300135 | A1* | 10/2016 | Moudy .................. H04L 67/01 |
| 2017/0043160 | A1* | 2/2017 | Goodall ................. A61B 5/318 |
| 2017/0098122 | A1 | 4/2017 | El Kaliouby et al. |
| 2017/0102783 | A1* | 4/2017 | Shikii .................. G06F 3/0304 |
| 2017/0119918 | A1* | 5/2017 | Lima ...................... A61L 9/037 |
| 2018/0075490 | A1 | 3/2018 | Chintalapoodi et al. |
| 2018/0093625 | A1* | 4/2018 | Shintani ................. B60K 35/28 |
| 2019/0159716 | A1* | 5/2019 | Alailima .................. G09B 5/00 |

FOREIGN PATENT DOCUMENTS

| | | |
|---|---|---|
| CN | 107807947 A | 3/2018 |
| EP | 3293691 A | 3/2018 |
| JP | 07-028095 A | 1/1995 |
| JP | 2005-346471 A | 12/2005 |
| JP | 2007-087346 A | 4/2007 |
| JP | 2009-015372 A | 1/2009 |
| JP | 2014-078704 A | 5/2014 |
| JP | 2017-073107 A | 4/2017 |
| JP | 2018-041460 A | 3/2018 |
| KR | 2013-0022434 A | 3/2013 |
| KR | 2018-0028939 A | 3/2018 |
| TW | 201417300 | 5/2014 |
| WO | WO-2014/046222 | 3/2014 |

OTHER PUBLICATIONS

Written Opinion (Application No. PCT/IB2019/054895) Dated Sep. 24, 2019.
Lehrer.J et al., "Ambient odor of orange in a dental office reduces anxiety and improves mood in female patients", Physiology & Behavior, 2000, vol. 71, No. 1-2, pp. 83-86, Elsevier.
Chinese Office Action (Application No. 201980040231.6) Dated Jan. 6, 2024.

* cited by examiner

Data processing device 10

Image display device 20

DATA PROCESSING METHOD, IMAGE DISPLAY METHOD, DATA PROCESSING DEVICE, AND IMAGE DISPLAY DEVICE

CROSS REFERENCE TO RELATED APPLICATIONS

This application is a continuation of U.S. application Ser. No. 17/251,448, filed Dec. 11, 2020, now Allowed, which is incorporated by reference and is a U.S. National Phase application under 35 U.S.C. § 371 of International Application PCT/IB2019/054895, filed on Jun. 12, 2019, which is incorporated by reference and claims the benefit of a foreign priority application filed in Japan on Jun. 22, 2018, as Application No. 2018-118485.

TECHNICAL FIELD

One embodiment of the present invention relates to an image display method. One embodiment of the present invention relates to an image display device. One embodiment of the present invention relates to a facial expression recognition technique.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

Techniques of recognizing facial expressions from captured images of faces are known. Facial expression recognition is applied, for example, to a technique by which a digital camera or the like captures images automatically at the moment when a subject smiles or when the subject stares into the camera.

As a technique of facial expression recognition, for example, Patent Document 1 discloses a technique in which facial feature points are detected and facial expressions are recognized with high accuracy on the basis of the feature points.

REFERENCE

Patent Document

[Patent Document 1] Japanese Published Patent Application No. 2007-087346

SUMMARY OF THE INVENTION

Problems to be Solved by the Invention

Actions of the human depend on emotions at that time. The human can control emotions unconsciously in many cases; thus, when a relatively small stimulus inducing a change in emotions is applied, the human can keep his/her mind calm. However, when a great stimulus inducing a change in emotions is applied, the human cannot control emotions well and thus might unconsciously take actions on the basis of emotions.

Such a change in emotions might reduce concentration. When concentration is reduced, for example, the work efficiency or the work accuracy is decreased even in the case where the same work is carried out. A reduction in concentration due to emotions sometimes causes an accident or disaster. In particular, when the human drives a car or the like, a reduction in concentration may lead to an extremely dangerous accident.

An object of one embodiment of the present invention is to provide a device or a method for inhibiting a reduction in concentration due to a change in emotions. Another object of one embodiment of the present invention is a device or a method capable of suitably reducing a change in emotions of the human.

Another object of one embodiment of the present invention is to provide a novel image display method. Another object is to provide a novel image display device.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a method for processing data, in which part of a face of a user is detected; a feature of the face of the user is extracted from the detected part of the face; an emotion of the user is estimated from the feature; and data to be presented to the user is determined on the basis of the estimated emotion.

In the above, the part of the face of the user is preferably an eye or an eye and its vicinity.

Another embodiment of the present invention is a method for displaying an image, in which part of a face of a user is detected; a feature of the face of the user is extracted from the detected part of the face; an emotion of the user is estimated from the feature; and an image to be presented to the user is determined on the basis of the estimated emotion.

In the above, when the estimated emotion includes at least one of irritation, impatience, anger, indignation, sadness, excitement, anxiety, fear, dissatisfaction, suffering, and emptiness, an image easing the emotion is preferably presented to the user.

Alternatively, when the estimated emotion includes at least one of irritation, impatience, anger, indignation, sadness, excitement, anxiety, fear, dissatisfaction, suffering, and emptiness, an image making the user recognize the emotion is preferably presented.

In the above, the feature is preferably extracted by inference using a neural network.

In the above, the emotion is preferably estimated by inference using a neural network.

Another embodiment of the present invention is a data processing device including a data presentation unit presenting data to a user, a subject detection unit detecting part of a face of the user, a feature extraction unit extracting a feature of the face of the user from the detected part of the face of the user, an emotion estimation unit estimating an emotion of the user from the extracted feature, and a data generation unit generating data to be presented to the user on the basis of the estimated emotion.

Another embodiment of the present invention is an image display device including an image display unit presenting an image to a user, a subject detection unit detecting part of a face of the user, a feature extraction unit extracting a feature of the face of the user from the detected part of the face of the user, an emotion estimation unit estimating an emotion of the user from the extracted feature, and an image generation unit generating an image to be displayed on the image display unit on the basis of the estimated emotion.

In the above, the feature extraction unit preferably extracts the feature by inference using a neural network.

In the above, it is preferable that the image display unit include a light-emitting element and a first transistor electrically connected to the light-emitting element, and the subject detection unit include a sensor element and a second transistor electrically connected to the sensor element. The first transistor and the second transistor are preferably provided over one substrate.

In the above, the light-emitting element and the sensor element are preferably arranged side by side on one plane.

In the above, the first transistor or the second transistor preferably includes an oxide semiconductor in a semiconductor where a channel is formed.

Effect of the Invention

According to one embodiment of the present invention, a device or a method for inhibiting a reduction in concentration due to a change in emotions can be provided.

According to one embodiment of the present invention, a device or a method capable of suitably reducing a change in emotions of the human can be provided.

Note that the description of these effects does not preclude the existence of other effects. One embodiment of the present invention does not need to have all these effects. Note that effects other than these can be derived from the description of the specification, the drawings, the claims, and the like.

MODE FOR CARRYING OUT THE INVENTION

Figure 1:
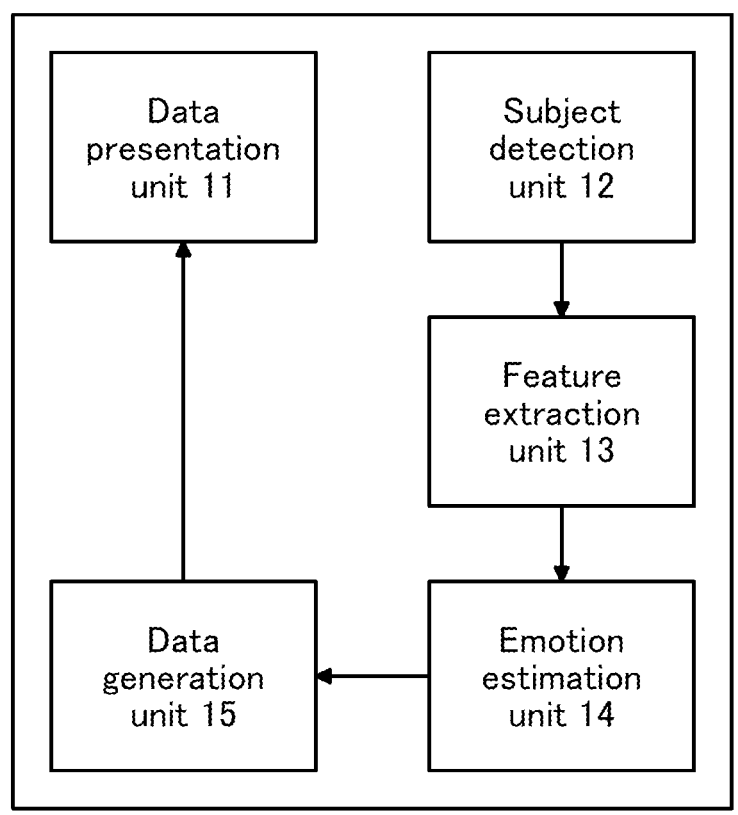
FIG. 1 is a diagram showing a structure example of a data processing device.

Embodiments will be described below with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, the ordinal numbers such as "first" and "second" are used in order to avoid confusion among components and do not limit the number.

A transistor is a kind of semiconductor elements and can achieve amplification of current or voltage, switching operation for controlling conduction or non-conduction, or the like. An IGFET (Insulated Gate Field Effect Transistor) and a thin film transistor (TFT) are in the category of a transistor in this specification.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, a coil, a capacitor, and other elements with a variety of functions as well as an electrode and a wiring.

In this specification and the like, a display panel which is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

One embodiment of the present invention detects part (in particular, an eye or an eye and its vicinity) or the whole of a user's face, extracts features of the user's face from data on the detected part or whole of the face, and estimates the user's emotions from the extracted features of the face. In the case where the estimated emotions might reduce concentration, for example, a stimulus is applied to the sense of sight, the sense of hearing, the sense of touch, the sense of smell, or the like of the user to recover the concentration of the user. This can effectively inhibit a reduction in the concentration that is not recognized by the user.

Examples of the emotions that might reduce concentration or the like include irritation, impatience, anger, indignation, sadness, excitement, anxiety, fear, dissatisfaction, suffering, and emptiness. Hereinafter, these emotions are collectively referred to as negative emotions in some cases. Note that in general, excitement is not limited to the negative emotions; here, excitement is an emotion that might reduce concentration or the like and thus is included in the negative emotions.

A stimulus is applied to the user preferably through the sense of sight. For example, an image that dispels the negative emotions of the user and calms down the user's mind can be displayed. Examples of such an image include an image relating to the nature such as an animal, a plant, and scenery. Note that the image that calms down the user's mind depends on the individuals; thus, a method may be employed in which an image set by the user in advance is displayed.

A stimulus applied to the user through the sense of sight may be a change in a color tone of a displayed image. For example, the tone of red is lowered and the tone of green or blue is raised in the color tone of a displayed image, so that the negative emotions of the user can be suppressed and the user can calm down. In that case, an instant and extreme change in the color tone may lead to an adverse effect such as an increase in irritation of the user; thus, the color tone is preferably changed gradually over time to the extent that the user hardly perceives the change. For example, in the case where an image can be displayed with 256 or more gray levels of each color, the color tone is gradually changed such that a gray level value changed in one second is lower than or equal to 1.

Examples of the stimulus that is applied to the user through the sense of sight include a gradual decrease in the brightness of a space where the user is present and the color tone of lighting that is made close to green or blue.

Examples of a stimulus that is applied through the sense of hearing to dispel the negative emotions of the user and calm down the user's mind include an environmental sound relating to the nature (e.g., a bird song and the sound of flowing water).

A reduction in the concentration or the like of the user can be suitably inhibited by making the user realize the estimated current emotion instead of applying a stimulus for calming down the user's mind to the user. When recognizing the negative emotions which the user is not aware of, the user can consciously take actions to calm down the user's mind. For example, the user can consciously take a deep breath and take a rest by stopping the work or the driving.

As a method for making the user recognize the current emotion, a character whose facial expression is close to the current emotion of the user can be displayed on a screen and an image in which the level of the emotion (e.g., the level of irritation) is quantified or graphically represented can be displayed on a screen, for example. Alternatively, in the case where the user is estimated to significantly get emotional, for example, an alert can be issued to the user with the use of a sound, lighting, a smell, or the like. In particular, when an alert is issued through the sense of sight using display of an image at the same time as an alert that affects the sense of hearing, the sense of smell, the sense of touch, or the like, the user can recognize the current emotion more effectively.

A method for estimating the user's emotions is described. First, an image of part of the face of the user (subject) including an eye or an eye and its vicinity is captured. Then, features of the face are extracted from the captured part of the user's face. After that, the current emotion of the user is estimated from the extracted features of the face. The feature extraction and the emotion estimation can be suitably performed by inference using a neural network.

More specific examples are described below with reference to drawings.

Structure Example

FIG. 1 is a block diagram of a data processing device 10 of one embodiment of the present invention. The data processing device 10 includes a data presentation unit 11, a subject detection unit 12, a feature extraction unit 13, an emotion estimation unit 14, and a data generation unit 15.

Note that in the drawings attached to this specification, the block diagram in which components are classified according to their functions and shown as independent blocks is illustrated; however, it is difficult to separate actual components completely according to their functions, and one component may be related to a plurality of functions or a plurality of components may achieve one function.

[Data Presentation Unit 11]

The data presentation unit 11 has a function of applying a stimulus to the sense of sight, the sense of smell, the sense of hearing, or the sense of touch of the user. The data presentation unit 11 can present (output) data generated in the after-mentioned data generation unit 15 to the user.

Various kinds of hardware can be used for the data presentation unit 11. For example, in the case where a stimulus is applied to the sense of sight of the user (or data is presented), a display device capable of displaying images, a lighting device with variable illuminance or chromaticity, or the like can be used. As a device for applying a stimulus to the sense of smell, an aromatherapy diffuser that diffuses scent by vibration, heat, or the like can be used, for example. As a device for applying a stimulus to the sense of hearing, an audio output device such as a speaker, headphones, or earphones can be used. As a device for applying a stimulus to the sense of touch, a vibrator or the like can be used.

[Subject Detection Unit 12]

The subject detection unit 12 has a function of obtaining data on part of the user's face and outputting the data to the feature extraction unit 13.

As the subject detection unit 12, an imaging device including an image sensor can be typically used. In that case, an infrared imaging device that captures an image by irradiating the user's face with infrared rays may be used. Note that the subject detection unit 12 is not limited to an imaging device as long as a device can detect the state of part of the subject's face. An optical distance measurement device that measures the distance between the device and part of the face with the use of infrared rays or the like can also be used. A detection device that makes an electrode contact with the user's face to electrically detect muscle movement of the user's face may be used.

[Feature Extraction Unit 13]

The feature extraction unit 13 has a function of extracting feature points from the facial data output from the subject detection unit 12, extracting features of part or the whole of the face from the position of the feature points, and outputting data on the extracted features to the emotion estimation unit 14.

When facial data obtained by the subject detection unit 12 is data on the eye and its vicinity, examples of features that the feature extraction unit 13 extracts include a pupil, an iris, a cornea, a conjunctiva (the white of the eye), an inner canthus, an outer canthus, an upper eyelid, a lower eyelid, eyelashes, an eyebrow, a glabella, an inner end of an eyebrow, and an outer end of an eyebrow. Examples of features other than the eye and its vicinity include a nasal root, a nasal apex, a nasal bridge, a nostril, lips (an upper lip and a lower lip), a corner of the mouth, an oral aperture, teeth, a cheek, a chin, a jaw, and a forehead. The feature extraction unit 13 recognizes the shape, position, and the like of these facial parts and extracts the position coordinates of the feature point of each part. Then, data on the extracted position coordinates or the like can be output to the emotion estimation unit 14 as data on the facial features.

As a method for extracting features by the feature extraction unit 13, a variety of algorithms for extracting a feature point from an image or the like obtained by the subject detection unit 12 can be employed. For example, an algorithm such as SIFT (Scaled Invariant Feature Transform), SURF (Speeded Up Robust Features), or HOG (Histograms of Oriented Gradients) can be used.

In particular, feature extraction by the feature extraction unit 13 is preferably performed by neural network inference. It is particularly preferable to use convolutional neural networks (CNN). The case of using a neural network will be described below.

Figure 2A:
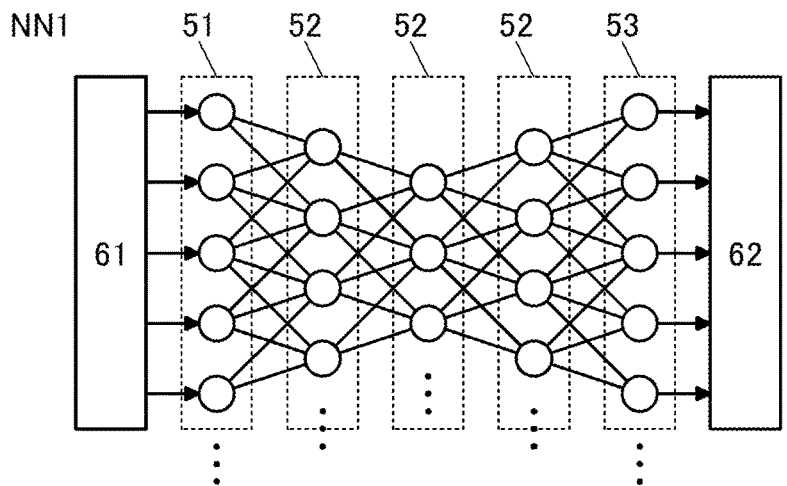
FIG. 2(A), FIG. 2(B), and FIG. 2(C) are diagrams showing a structure example of a data processing device.

FIG. 2(A) schematically shows a neural network NN1 that can be used in the feature extraction unit 13. The neural network NN1 includes an input layer 51, three intermediate layers 52, and an output layer 53. Note that the number of intermediate layers 52 is not limited to three and can be one or more.

Data 61 input from the subject detection unit 12 is input to the neural network NN1. The data 61 is data that includes coordinates and a value corresponding to the coordinates. The data 61 can be typically image data that includes coordinates and a gray level corresponding to the coordinates. Data 62 is output from the neural network NN1. The data 62 is data that includes the position coordinates of the aforementioned feature point.

The neural network NN1 has learned in advance so as to extract the aforementioned feature point from the data 61 such as image data and output its coordinates. The neural network NN1 has learned such that edge computing using various filters or the like in the intermediate layers 52 increases a neuron value of the output layer 53 corresponding to the coordinates of the aforementioned feature point.

[Emotion Estimation Unit 14]

The emotion estimation unit 14 has a function of estimating the user's emotions from data on the features of the face input from the feature extraction unit 13 and outputting data on the estimated emotions to the data generation unit 15.

The emotion estimation unit 14 can estimate whether or not the user feels the negative emotions (e.g., irritation, impatience, anger, indignation, sadness, excitement, anxiety, fear, dissatisfaction, suffering, and emptiness) with the use of the data on the features of the user's face. In the case where the user feels the negative emotions, the degree (level) thereof is preferably estimated.

Emotion estimation in the emotion estimation unit 14 is preferably performed by neural network inference. It is particularly preferable to use a CNN.

Figure 2B:
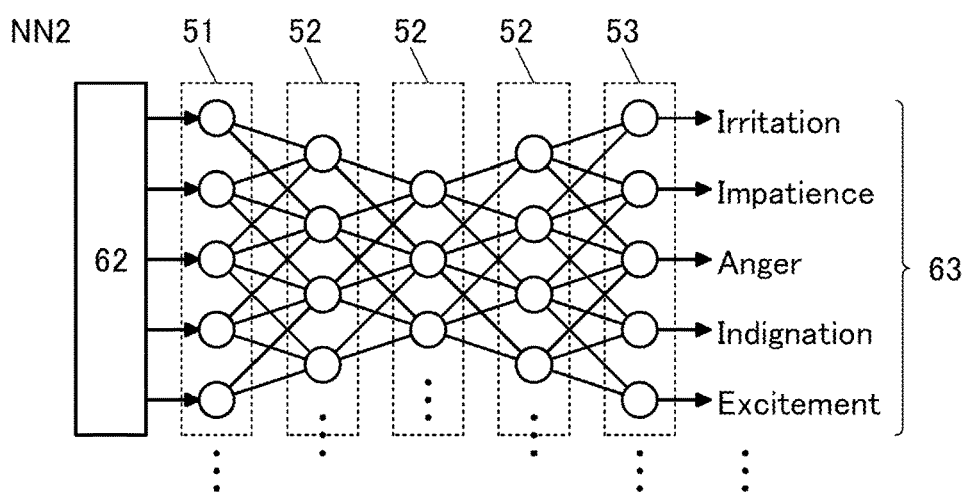

FIG. 2(B) schematically shows a neural network NN2 that can be used in the emotion estimation unit 14. An example where the neural network NN2 has substantially the same structure as the neural network NN1 is shown here. Note that the number of neurons of the input layer 51 in the neural network NN2 can be smaller than that in the neural network NN1.

The data 62 input from the feature extraction unit 13 is input to the neural network NN2. The data 62 includes data on the coordinates of the extracted feature point.

As data input to the neural network NN2, data obtained by processing the data 62 may be used. For example, data obtained by performing calculation of a vector connecting given two feature points on all of the feature points or some of the feature points may be used as data input to the neural network NN2. Moreover, data obtained by normalizing the calculated vectors may be used. Note that hereinafter, data obtained by processing the data 62 output from the neural network NN1 is also referred to as the data 62.

Data 63 is output from the neural network NN2 to which the data 62 is input. The data 63 corresponds to neuron values output from respective neurons of the output layer 53. Each neuron of the output layer 53 is associated with one emotion. As shown in FIG. 2(B), the data 63 is data that includes neuron values of the neurons each corresponding to a predetermined negative emotion (e.g., irritation, impatience, anger, indignation, and excitement).

The neural network NN2 has learned in advance so as to estimate the degree of the negative emotions from the data 62 and output the estimation as neuron values. The facial expression of the user can be determined on the basis of the relative positional relationship between a plurality of feature points on the user's face. Then, the user's emotion can be estimated from the facial expression by the neural network NN2.

Figure 2C:
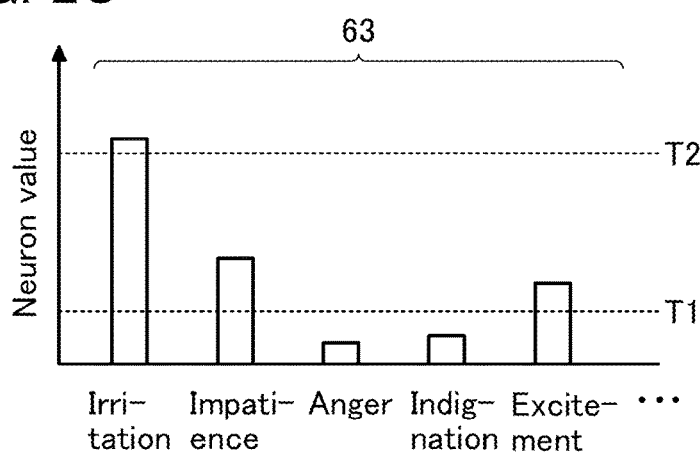

FIG. 2(C) is a diagram schematically showing data 63. The level of a neuron value corresponding to each emotion indicates the degree of an estimated emotion. A threshold value T1 and a threshold value T2 are indicated by dashed lines in the data 63. For example, when a neuron value is below the threshold value T1, it can be determined that the user does not feel the corresponding emotion or the degree of the corresponding emotion is sufficiently low. When a neuron value exceeds the threshold value T2, the degree of the corresponding emotion can be determined to be noticeably high.

For example, it can be estimated from FIG. 2(C) that the user feels an emotion in which "irritation", "impatience", and "excitement" are mixed; in particular, the user strongly feels "irritation".

As described above, the emotion estimation unit 14 estimates only the negative emotions and outputs the results to the data generation unit 15, so that the scale of the arithmetic operation in the emotion estimation unit 14 can be reduced, resulting in a reduction in power consumed in the arithmetic operation. In addition, the amount of data used in the data generation unit 15 can be reduced; thus, power consumed in the data transmission from the emotion estimation unit 14 to the data generation unit 15 and the arithmetic operation in the data generation unit 15 can also be reduced. Note that the emotion estimation unit 14 can estimate not only the negative emotions but also emotions opposite thereto, such as joy, appreciation, happiness, familiarity, satisfaction, and affection, and can output the results to the data generation unit 15.

Note that the emotion estimation can also be performed without using a neural network. For example, estimation may be performed by a template matching method or a pattern matching method, where an image of part of the user's face, which is obtained by the subject detection unit 12, is compared with a template image to use the degree of similarity therebetween. In that case, a structure without the feature extraction unit 13 can also be employed.

[Data Generation Unit 15]

The data generation unit 15 has a function of determining or generating data to be presented to the user on the basis of the emotion estimated by the emotion estimation unit 14 and outputting the data to the data presentation unit 11.

For example, when the data presentation unit 11 has a function of displaying images, the data generation unit 15 can generate or select an image to be displayed and output the data thereon to the data presentation unit 11. When the data presentation unit 11 has a function of a lighting device, the data generation unit 15 can determine the brightness (illuminance) and chromaticity of lighting and output the data to the data presentation unit 11. When the data presentation unit 11 has a function of diffusing scent, the data generation unit 15 can determine the type or strength of scent to be diffused and output a signal for controlling the operation of the data presentation unit 11, for instance. When the data presentation unit 11 has a function of outputting a sound, the data generation unit 15 can generate or select a sound to be reproduced and output the data thereon as well as data on the volume level for reproduction to the data presentation unit 11. When the data presentation unit 11 has a function of producing a vibration, the data generation unit 15 can determine the pattern and intensity of the vibration and output a signal for controlling the operation of the data presentation unit 11, for instance.

The above is the description of the structure example of the data processing device 10.

Modification Example

It is particularly preferable that the data processing device of one embodiment of the present invention present data to the user through the sense of sight. In the case where the data presentation unit included in the data processing device has a function of displaying an image, the data processing device can be called an image display device. An example of an image display device will be described below.

Figure 3:
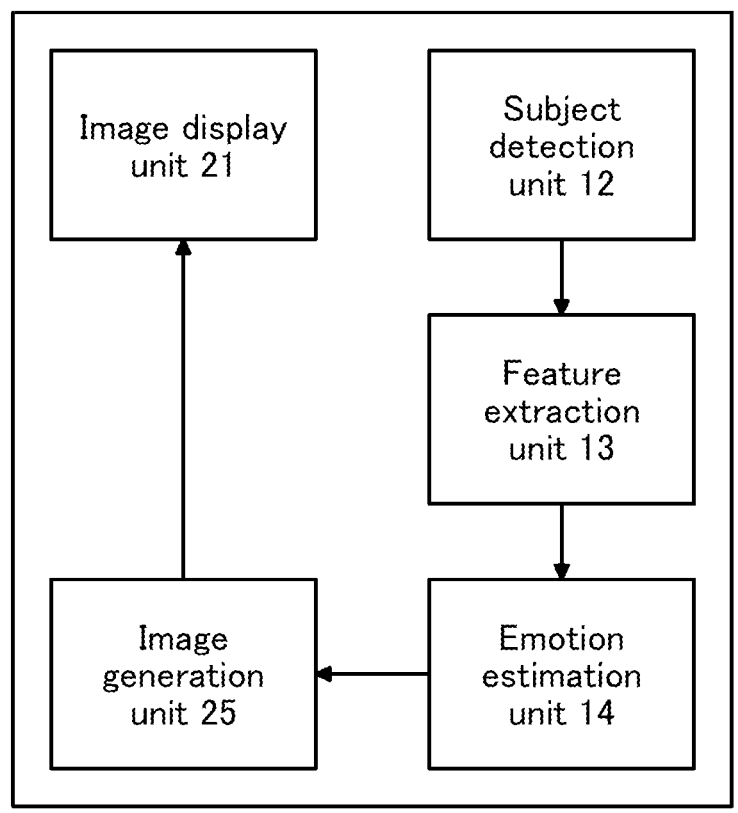
FIG. 3 is a diagram showing a structure example of an image display device.

FIG. 3 shows a structure example of an image display device 20 in which an image display unit 21 is used as the data presentation unit 11 in the data processing device 10 described in Structure example 1 above. The image display device 20 includes the image display unit 21 and an image generation unit 25.

The image generation unit 25 can select or generate an image to be displayed on the image display unit 21 on the basis of the data on the emotion input from the emotion estimation unit 14, and can output the image.

Figure 4:
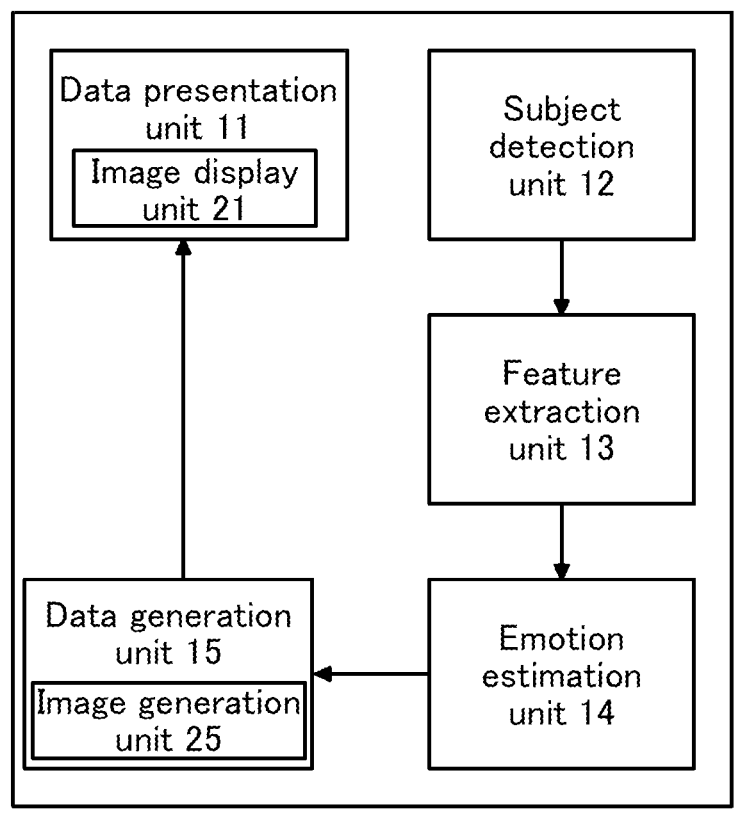
FIG. 4 is a diagram showing a structure example of an image display device.

FIG. 4 shows an example of the case where the data presentation unit 11 includes the image display unit 21. The data presentation unit 11 includes another data presentation means besides the image display unit 21. Thus, an image can be presented to the user and a stimulus can be applied to the sense of sight, the sense of hearing, the sense of smell, or the sense of touch by another means, so that notice can be synergistically given to the user.

In that case, the data generation unit 15 has a function of controlling the operation of, in addition to the image generation unit 25, another data presentation means of the data presentation unit 11, for example.

The above is the description of the modification examples.

[Example of Data to be Presented]

An example of image data to be presented to the user on the basis of the user's emotion estimated using one embodiment of the present invention will be described below.

Figure 5A:
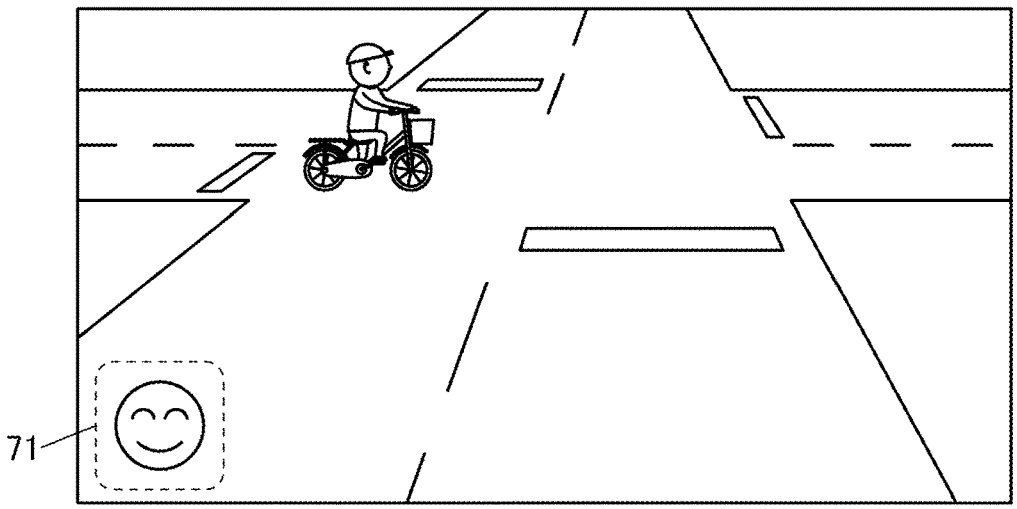
FIG. 5(A), FIG. 5(B), and FIG. 5(C) are diagrams illustrating examples of the field of view of a user.
Figure 5B:
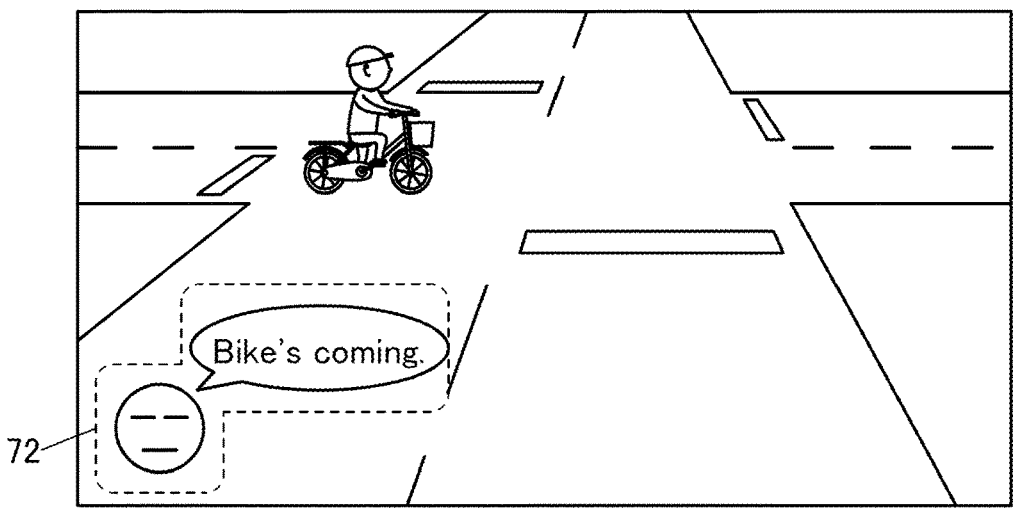
Figure 5C:
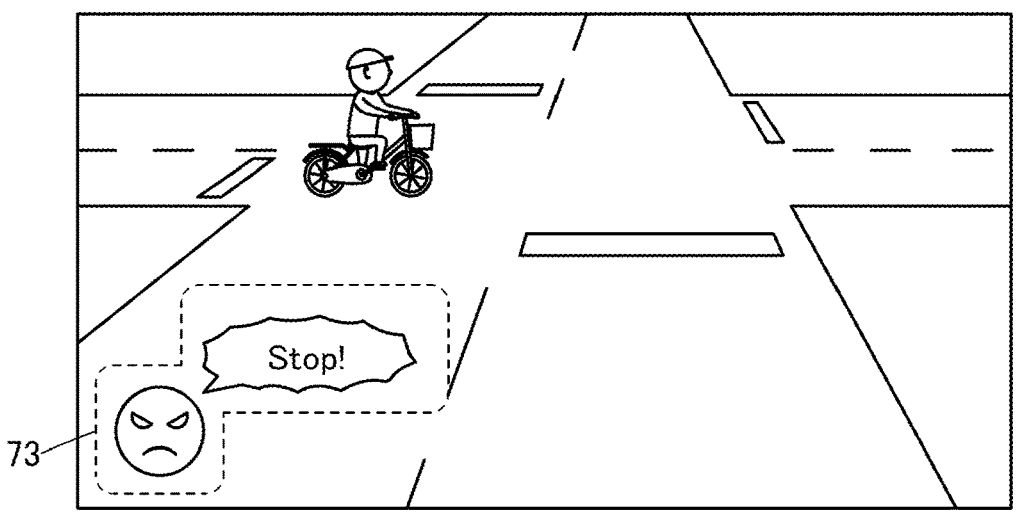

FIG. 5(A) to FIG. 5(C) each illustrate the field of view of the user at the time when the user drives a car or the like while wearing an AR device (AR: Augmented Reality). FIG. 5(A) to FIG. 5(C) illustrate the same situation where a passenger riding on a bicycle is to pass across the path of the user. In addition, image data 71, image data 72, or image data 73 imitating a character and being superimposed on scenery such as a road in movement is presented at the lower left of the field of view of the user.

FIG. 5(A) illustrates an example of the case where the user is estimated to hardly feel the negative emotions. For example, FIG. 5(A) corresponds to the case where none of the neuron values corresponding to the negative emotions in the data 63 exceed the threshold value T1 in FIG. 2(C).

In that case, it can be determined that concentration is not reduced by the user's emotion. The character in the image data 71 smiles on the basis of the estimated user's emotion. When looking at the image data 71, the user can recognize that the emotion is relatively calm and thus can keep concentrating on driving.

FIG. 5(B) illustrates an example of the case where the user is estimated to feel the negative emotions slightly. For example, FIG. 5(B) corresponds to the case where at least one of all the neuron values corresponding to the negative emotions in the data 63 is between the threshold value T1 and the threshold value T2 and none of them exceed the threshold value T2 in FIG. 2(C).

In that case, it can be determined that concentration is slightly reduced on the basis of the estimated user's emotion and its degree. Thus, the character in the image data 72 reflects the user's emotion and is expressionless instead of smiling. When looking at the image data 72, the user can recognize that the user feels the negative emotions slightly and thus can take actions consciously to calm down the user's mind.

Furthermore, there is a possibility that the user is not aware of the passenger who is to pass across the path of the user; thus, notification indicating the presence of the passenger is expressed as words of the character (Bike's coming). At this time, notification by display and sound can give notice to the user more effectively.

FIG. 5(C) illustrates an example of the case where the user is estimated to feel the negative emotions strongly. For example, FIG. 5(C) corresponds to the case where at least one of all the neuron values corresponding to the negative emotions in the data 63 exceeds the threshold value T2 in FIG. 2(C).

In that case, it can be determined that concentration is greatly reduced on the basis of the estimated user's emotion and its degree. Thus, the character in the image data 73 has a facial expression reflecting the user's emotion (here, strongly irritated facial expression). When looking at the image data 72, the user can recognize that the user strongly feels the negative emotions and thus can take a rest by stopping the driving, for example.

Furthermore, it is highly probable that the user is not aware of the passenger; thus, an alert that prompts the user to stop the car, instead of the notification indicating the presence of the passenger, is expressed as words of the character (Stop!). At this time, the alert is preferably issued using display and sound. Moreover, the user may be warned by blinking the lighting or changing the chromaticity of the lighting, for example.

As described above, when a character with a facial expression that reflects the estimated user's emotion is presented to the user, the user can realize the emotion which the user is not aware of. Although the method in which data on the emotion is presented to the user using the facial expression of the character is described here, one embodiment of the present invention is not limited thereto, and various images can be used as long as the images visualize the kind or degree of the emotion.

At least part of this embodiment can be implemented in combination with the other embodiments described in this specification as appropriate.

Embodiment 2

In this embodiment, a hardware structure example of the data processing device of one embodiment of the present invention will be described.

Figure 6:
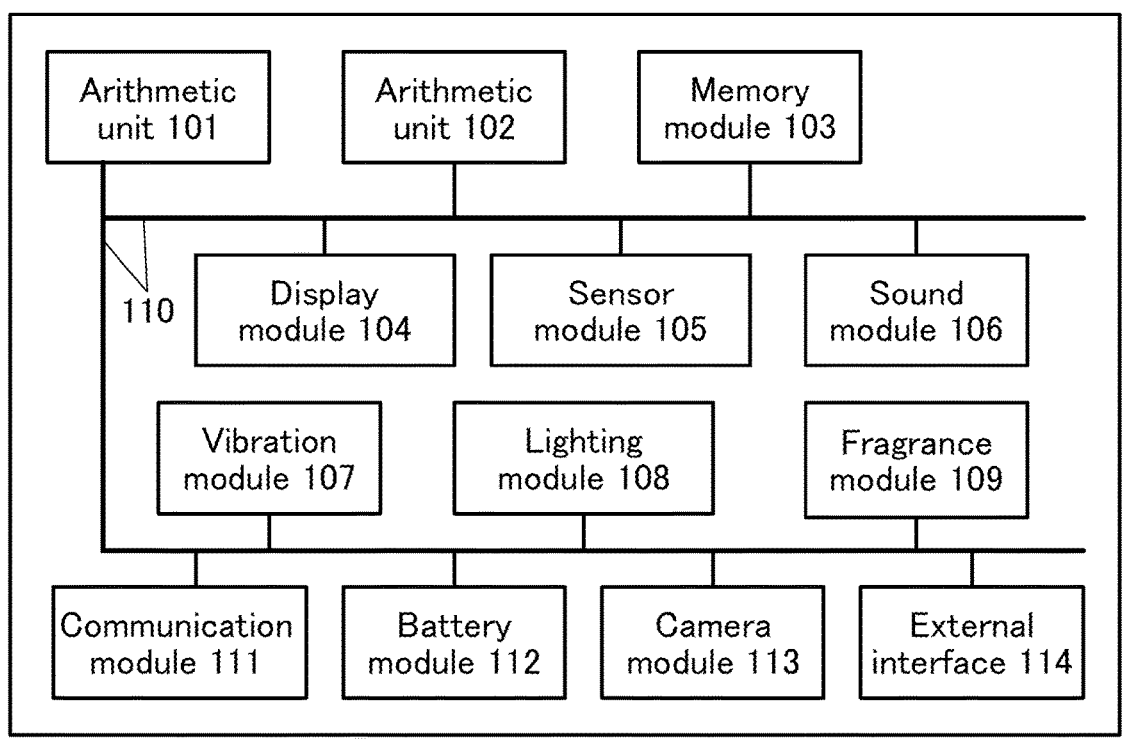
FIG. 6 is a diagram showing a structure example of a data processing device.

FIG. 6 shows a block diagram of a data processing device 100 described below. The data processing device 100 includes an arithmetic unit 101, an arithmetic unit 102, a memory module 103, a display module 104, a sensor module 105, a sound module 106, a vibration module 107, a lighting module 108, a fragrance module 109, a communication module 111, a battery module 112, a camera module 113, an external interface 114, and the like.

Note that the data processing device 100 can display an image using the display module 104 and thus can be called an image display device.

The arithmetic unit 102, the memory module 103, the display module 104, the sensor module 105, the sound module 106, the vibration module 107, the lighting module 108, the fragrance module 109, the communication module 111, the battery module 112, the camera module 113, the external interface 114, and the like are connected to the arithmetic unit 101 via a bus line 110.

The display module 104, the sound module 106, the vibration module 107, the lighting module 108, and the fragrance module 109 each correspond to the data presentation unit 11 or the image display unit 21 described in Embodiment 1. The sensor module 105 or the camera module 113 corresponds to the subject detection unit 12. The feature extraction unit 13, the emotion estimation unit 14, and the data generation unit 15 can be formed using the arithmetic unit 101 or the arithmetic unit 102, the memory module 103, and the like.

The arithmetic unit 101 can function as, for example, a central processing unit (CPU). The arithmetic unit 101 has a function of controlling components of the arithmetic unit 102, the memory module 103, the display module 104, the sensor module 105, the sound module 106, the vibration module 107, the lighting module 108, the fragrance module 109, the communication module 111, the battery module 112, the camera module 113, the external interface 114, and the like, for example.

Signals are transmitted between the arithmetic unit 101 and the components via the bus line 110. The arithmetic unit 101 has a function of processing signals input from the components which are connected via the bus line 110, a function of generating signals to be output to the components, and the like, so that the components connected to the bus line 110 can be controlled comprehensively.

Note that a transistor that includes an oxide semiconductor in a channel formation region and that achieves an extremely low off-state current can be used in an IC or the like included in the arithmetic unit 101, the arithmetic unit 102, or another component. Since the transistor has an extremely low off-state current, the transistor is used as a switch for holding electric charge (data) which flows into a capacitor functioning as a memory element, whereby a long data retention period can be ensured. Utilizing this characteristic for a register or a cache memory of the arithmetic unit 101 or the arithmetic unit 102 enables normally-off computing where the arithmetic unit 101 or the arithmetic unit 102 operates only when needed and data on the previous processing is stored in the memory element in the other case; thus, power consumption of the data processing device 100 can be reduced.

The arithmetic unit 101 interprets and executes instructions from various programs with the use of a processor to process various kinds of data and control programs. Programs that might be executed by the processor may be stored in a memory region of the processor or may be stored in the memory module 103.

A CPU and other microprocessors such as a DSP (Digital Signal Processor) and a GPU (Graphics Processing Unit) can be used alone or in combination as the arithmetic unit 101. A structure may be employed in which such a microprocessor is obtained with a PLD (Programmable Logic Device) such as an FPGA (Field Programmable Gate Array) or an FPAA (Field Programmable Analog Array).

The arithmetic unit 101 may include a main memory. The main memory can have a structure in which a volatile memory such as a RAM (Random Access Memory) or a nonvolatile memory such as a ROM (Read Only Memory) is provided.

For example, a DRAM (Dynamic Random Access Memory) is used for the RAM provided in the main memory, in which case a memory space as a workspace for the arithmetic unit 101 is virtually allocated and used. An operating system, an application program, a program module, program data, and the like which are stored in the memory module 103 are loaded into the RAM to be executed. The data, program, and program module which are loaded into the RAM are directly accessed and operated by the arithmetic unit 101.

Meanwhile, a BIOS (Basic Input/Output System), firmware, and the like for which rewriting is not needed can be stored in the ROM. As the ROM, a mask ROM, an OTPROM (One Time Programmable Read Only Memory), an EPROM (Erasable Programmable Read Only Memory), or the like can be used. Examples of the EPROM include a UV-EPROM (Ultra-Violet Erasable Programmable Read Only Memory) which can erase stored data by ultraviolet irradiation, an EEPROM (Electrically Erasable Programmable Read Only Memory), and a flash memory.

As the arithmetic unit 102, a processor specialized for parallel arithmetic operation as compared with a CPU is preferably used. For example, a processor including a large number of (several tens to several hundreds of) processor cores capable of parallel processing, such as a GPU, a TPU (Tensor Processing Unit), or an NPU (Neural Processing Unit), is preferably used. Accordingly, the arithmetic unit 102 can especially perform arithmetic operation by a neural network at high speed.

As the memory module 103, a memory device using a nonvolatile memory element, such as a flash memory, an MRAM (Magnetoresistive Random Access Memory), a PRAM (Phase change RAM), an ReRAM (Resistive RAM), or an FeRAM (Ferroelectric RAM); a memory device using a volatile memory element, such as a DRAM (Dynamic RAM) or an SRAM (Static RAM); or the like may be used, for example. Furthermore, a memory media drive such as a hard disk drive (HDD) or a solid state drive (SSD) may be used, for example.

A memory device that can be connected and disconnected through the external interface 114 with a connector, such as an HDD or an SSD, or a media drive for a recording medium such as a flash memory, a Blu-ray disc, or a DVD can be used as the memory module 103. Note that the memory module 103 is not incorporated in the data processing device 100, and a memory device located outside may be used as the memory module 103. In that case, the memory device may be connected through the external interface 114, or data transmission and reception may be wirelessly performed using the communication module 111.

The display module 104 includes a display panel, a display controller, a source driver, a gate driver, and the like. An image can be displayed on a display surface of the display panel. The display module 104 may further include a projection portion (screen) to employ a method in which an image displayed on the display surface of the display panel is projected on the screen. In that case, when a material that transmits visible light is used for the screen, an AR device in which a displayed image is superimposed on a background image can be obtained.

Examples of a display element that can be used for the display panel include a liquid crystal element, an organic EL element, an inorganic EL element, an LED element, a microcapsule, an electrophoretic element, an electrowetting element, an electrofluidic element, an electrochromic element, and a MEMS element.

A touch panel having a touch sensor function can be used as the display panel. In that case, the display module 104 includes a touch sensor controller, a sensor driver, and the like. As the touch panel, an on-cell touch panel or an in-cell touch panel in which a display panel and a touch sensor are combined is preferable. The on-cell or in-cell touch panel can be thin and lightweight. The on-cell or in-cell touch panel has fewer components and can therefore reduce cost.

The sensor module 105 includes a sensor unit and a sensor controller. The sensor controller converts the input from the sensor unit into a control signal and outputs it to the arithmetic unit 101 via the bus line 110. The sensor controller may handle errors made by the sensor unit or may calibrate the sensor unit. Note that the sensor controller may include a plurality of controllers which control the sensor unit.

The sensor unit included in the sensor module 105 preferably includes a photoelectric conversion element that detects visible light, infrared rays, ultraviolet rays, or the like and outputs the detection intensity thereof. In that case, the sensor unit can be called an image sensor unit.

The sensor module 105 preferably includes, in addition to the sensor unit, a light source emitting visible light, infrared rays, or ultraviolet rays. In particular, in the case where the sensor module 105 is used for detecting part of the user's face, including a light source emitting infrared rays enables an image to be captured with high sensitivity without making the user feel the glare.

The sensor module 105 may include a variety of sensors which have a function of measuring force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, or infrared rays.

The sound module 106 includes an audio input portion, an audio output portion, a sound controller, and the like. The audio input portion includes a microphone, an audio input connector, or the like, for example. The audio output portion includes a speaker, an audio output connector, or the like, for example. The audio input portion and the audio output portion are connected to the sound controller, and are connected to the arithmetic unit 101 via the bus line 110. Audio data input to the audio input portion is converted into a digital signal in the sound controller and then processed in the sound controller and the arithmetic unit 101. By contrast, the sound controller generates an analog audio signal audible to a user in response to instructions from the arithmetic unit 101 and outputs it to the audio output portion. To the audio output connector of the audio output portion, an audio output device such as earphones, headphones, or a headset can be connected and a sound generated in the sound controller is output to the device.

The vibration module 107 can include a vibrating element and a vibration controller for controlling the vibrating element. As the vibrating element, an element capable of converting an electric signal or a magnetic signal into vibration, such as a vibration motor (eccentric motor), a resonant actuator, a magnetostrictive element, or a piezoelectric element can be used.

The vibration module 107 can vibrate the vibrating element with a variety of vibration patterns by controlling the number of vibrations, the amplitude, vibration time, and the like of the vibrating element in response to instructions from the arithmetic unit 101.

The lighting module 108 can include a lighting tool and a lighting controller. As the lighting tool, a variety of lighting devices such as a light bulb, a fluorescent lamp, and a lighting panel in which organic EL elements or LED elements are arranged on a plane or in a belt-like manner can be used. In particular, a lighting device capable of changing the chromaticity and the illuminance is preferably used.

The lighting module 108 can control the illuminance and the color tone of the lighting with the use of the lighting controller in response to an instruction from the arithmetic unit 101.

The fragrance module 109 can include an air freshener, a heating device for applying heat to the air freshener or a vibration device for applying vibration, and a controller that controls the device. The air freshener is preferably replaceable so that the user can freely select it to meet the user's preference. A liquid, gel, or solid air freshener can be used.

The fragrance module 109 can control the amount of scent from the air freshener in response to an instruction from the arithmetic unit 101. When two or more kinds of air fresheners can be included, different kinds of scent can be selected or two or more kinds of scent can be combined and diffused.

The communication module 111 can perform communication via an antenna. For example, the communication module 111 controls a control signal for connecting the data processing device 100 to a computer network in response to instructions from the arithmetic unit 101 and transmits the signal to the computer network. Accordingly, communication can be performed by connecting the data processing device 100 to a computer network such as the Internet, an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case where a plurality of communication methods are used, a plurality of antennas for the communication methods may be included.

The communication module 111 is provided with a high frequency circuit (RF circuit), for example, to transmit and receive an RF signal. The high frequency circuit is a circuit for performing mutual conversion between an electromagnetic signal and an electric signal in a frequency band that is set by national laws to perform wireless communication with another communication apparatus using the electromagnetic signal. As a practical frequency band, several tens of kilohertz to several tens of gigahertz are generally used. A structure can be employed in which the high frequency circuit connected to an antenna includes a high frequency circuit portion compatible with a plurality of frequency bands and the high frequency circuit portion includes an amplifier, a mixer, a filter, a DSP, an RF transceiver, or the like. In the case of performing wireless communication, it is possible to use, as a communication protocol or a communication technology, a communications standard such as LTE (Long Term Evolution), or a communications standard developed by IEEE, such as Wi-Fi (registered trademark) or Bluetooth (registered trademark).

The communication module 111 may have a function of connecting the data processing device 100 to a telephone line. The communication module 111 may include a tuner for generating a video signal, which is to be output to the display module 104, from airwaves received by the antenna.

The battery module 112 can include a secondary battery and a battery controller. Typical examples of the secondary battery include a lithium-ion secondary battery and a lithium-ion polymer secondary battery. The battery controller can have a function of supplying power accumulated in a battery to the components, a function of receiving power supplied from the outside and charging the battery, and a function of controlling the charging operation in response to the charge state of the battery, for example. The battery controller can include a BMU (Battery Management Unit), for example. The BMU collects data on cell voltage or cell temperatures of the battery, monitors overcharge and overdischarge, controls a cell balancer, handles a deterioration state of the battery, calculates the remaining battery power level (State Of Charge: SOC), and controls detection of a failure, for example.

The camera module 113 can include an imaging element and a controller. A still image or a moving image can be captured at the press of a shutter button or by the operation of the touch panel of the display module 104, for example. The captured image or video data can be stored in the memory module 103. The image or the video data can be processed in the arithmetic unit 101 or the arithmetic unit 102. The camera module 113 may include a light source for capturing images. For example, a lamp such as a xenon lamp, a light-emitting element such as an LED or an organic EL, or the like can be used. Alternatively, the display panel of the display module 104 may be used as the light source for capturing images to utilize light emitted from the display panel. In that case, light of various colors besides white may be used for capturing images.

Examples of the external interface 114 include a physical button provided on the housing of the data processing device 100 and an external port to which another input component can be connected.

The external port included in the external interface 114 can be connected to a device, e.g., an input means such as a keyboard or a mouse, an output means such as a printer, or a storage means such as an HDD, through a cable. A USB terminal is a typical example. As the external port, a LAN (Local Area Network) connection terminal, a digital broadcast-receiving terminal, an AC adaptor connection terminal, or the like may be provided. Without limitation to wire communication, a transceiver for optical communication using infrared rays, visible light, ultraviolet rays, or the like may be provided.

The above is the description of the hardware structure of the data processing device 100.

At least part of this embodiment can be implemented in combination with the other embodiments described in this specification as appropriate.

Embodiment 3

In this embodiment, a device having a function of detecting light and a function of displaying an image will be described. The device described below can be used for the data presentation unit and the subject detection unit in the data processing device of one embodiment of the present invention.

The device described in this embodiment includes a first pixel circuit including a photoelectric conversion element such as a photodiode and a second pixel circuit including a display element such as an organic EL element or a liquid crystal element. The first pixel circuits and the second pixel circuits are arranged in a matrix.

A display unit is formed of the display elements arranged in a matrix, and an image can be displayed on the display unit. An imaging unit is formed of the photoelectric conversion elements arranged in a matrix, and data on the face of the user looking at the image can be acquired by the imaging unit. When the display unit and the imaging unit are combined, light that is emitted from the display unit and reflected by the user's face can be directly captured, so that an image can be captured without occurrence of a shortage of the amount of light even in a dark place, for example.

Since the display unit and the imaging unit can be combined, an image can be captured in the state where the user's sight line is always directed to the imaging unit while the user looks at the screen, so that data on the user's eye and its vicinity can be detected with higher accuracy. By contrast, in the case where a camera or the like is provided in a different position from the display unit, for example, the sight line is not directed to a lens of the camera while the user looks at the screen; thus, accurate data on the front of the user's face is difficult to obtain, which may lead to a decrease in the accuracy of the emotion estimation. In particular, in the case where a region to be detected is small, e.g., in the case where an eye and the vicinity of the eye are detected, acquiring data on a face with high accuracy is important.

Figure 7A:
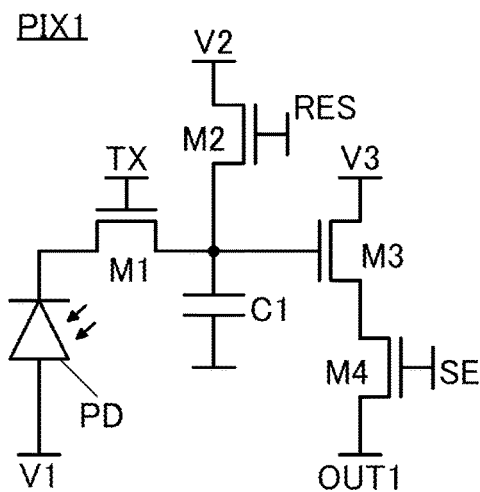
FIG. 7(A), FIG. 7(B), and FIG. 7(C) are diagrams showing structure examples of pixel circuits.

FIG. 7(A) illustrates an example of a pixel circuit including a photoelectric conversion element (light-receiving element). A pixel circuit PIX1 illustrated in FIG. 7(A) includes a light-receiving element PD, a transistor M1, a transistor M2, a transistor M3, a transistor M4, and a capacitor C1. Here, an example of the case where a photodiode is used as the light-receiving element PD is illustrated.

An anode of the light-receiving element PD is electrically connected to a wiring V1, and a cathode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential can be supplied to the wiring V1, the wiring V2, and the wiring V3. When the light-receiving element PD is driven with a reverse bias, the wiring V2 can be supplied with a potential higher than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving element PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1.

Figure 7B:
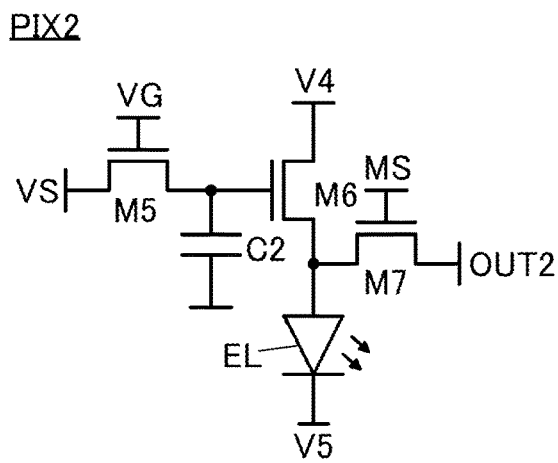

FIG. 7(B) illustrates an example of a pixel circuit including a light-emitting element as a display element. A pixel circuit PIX2 illustrated in FIG. 7(B) includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting element EL and one of a source and a drain of the transistor M7. A gate of the transistor M7 is electrically connected to a wiring MS, and the other of the source and the drain is electrically connected to a wiring OUT2. A cathode of the light-emitting element EL is electrically connected to a wiring V5.

A constant potential can be supplied to the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of outputting a potential between the transistor M6 and the light-emitting element EL to the outside through the wiring OUT2.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 7(A) and FIG. 7(B), p-channel transistors can be used as appropriate.

The pixel circuits PIX1 and the pixel circuits PIX2 are preferably formed side by side over the same substrate. It is particularly preferable that the pixel circuits PIX1 and the pixel circuits PIX2 be mixed and periodically arranged in one region.

In the pixel circuit PIX1 and the pixel circuit PIX2, one or a plurality of layers including the transistor and the capacitor are preferably stacked below a layer in which the light-receiving element PD or the light-emitting element EL is provided. Thus, the effective area of each pixel circuit can be reduced, and a high-resolution light-receiving unit or display unit can be achieved.

Figure 7C:
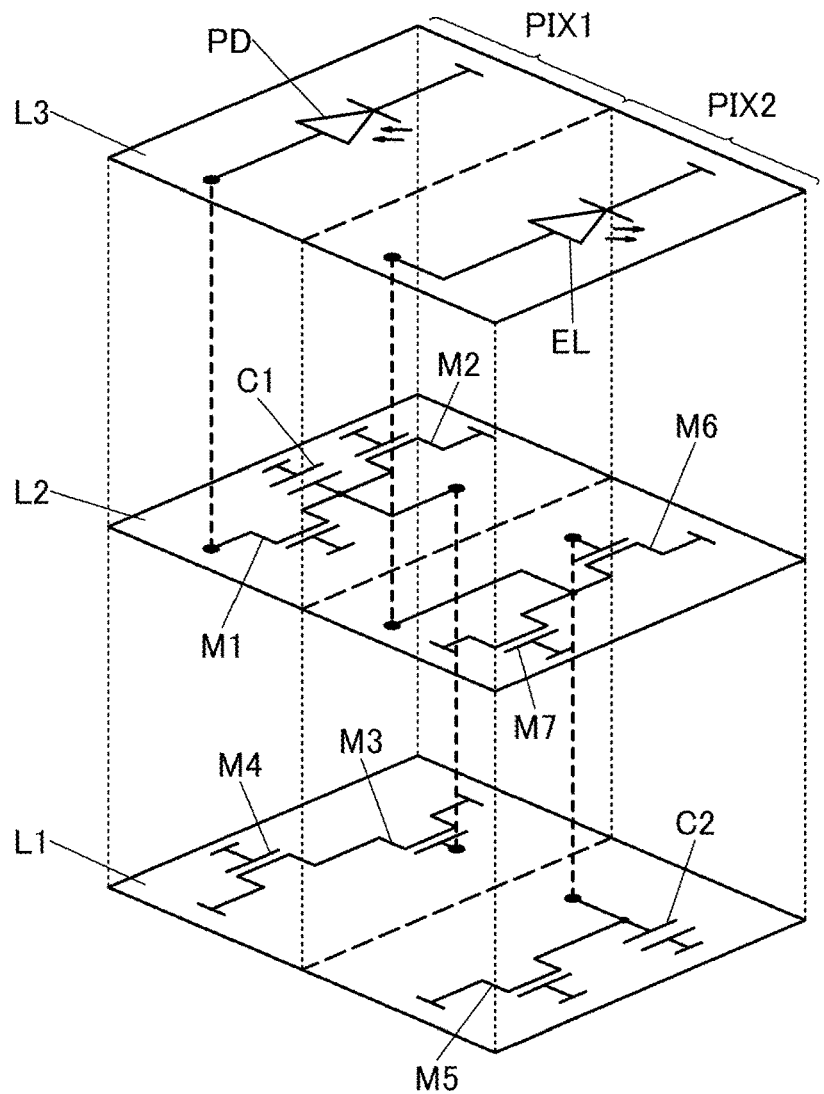

FIG. 7(C) illustrates an example of the case where the pixel circuit PIX1 and the pixel circuit PIX2 each have a stacked-layer structure of three layers. In the structure illustrated in FIG. 7(C), three layers (a first layer L1, a second layer L2, and a third layer L3) are stacked.

In the first layer L1, the transistor M3, the transistor M4, the transistor M5, and the capacitor C2 are provided. In the second layer L2, the transistor M1, the transistor M2, the transistor M6, the transistor M7, and the capacitor C1 are provided. In the third layer L3, the light-receiving element PD and the light-emitting element EL are provided.

In this manner, the light-receiving element PD and the light-emitting element EL are provided side by side in the same layer, so that a malfunction of the light-receiving element PD due to light emitted from the light-emitting element EL can be prevented.

The capacitor C1 and the capacitor C2 are preferably formed in different layers as illustrated in FIG. 7(C), in which case the occupation area thereof can be made large.

Although an example of the stacked-layer structure of three layers is illustrated here, the number of layers is not limited thereto and may be two, or four or more. The numbers and arrangements of the transistors and the capacitors provided in each layer are not limited to the above, and the pixel layout pattern is designed as appropriate in accordance with the required specifications.

At least part of this embodiment can be implemented in combination with the other embodiments described in this specification as appropriate.

Embodiment 4

In this embodiment, a structure example of a display device that can be used for the data processing device or the like of one embodiment of the present invention will be described. In particular, a display device which includes a light-receiving element and a display element and in which a display unit and an imaging unit are combined is described here.

Structure Example 1

Figure 8:
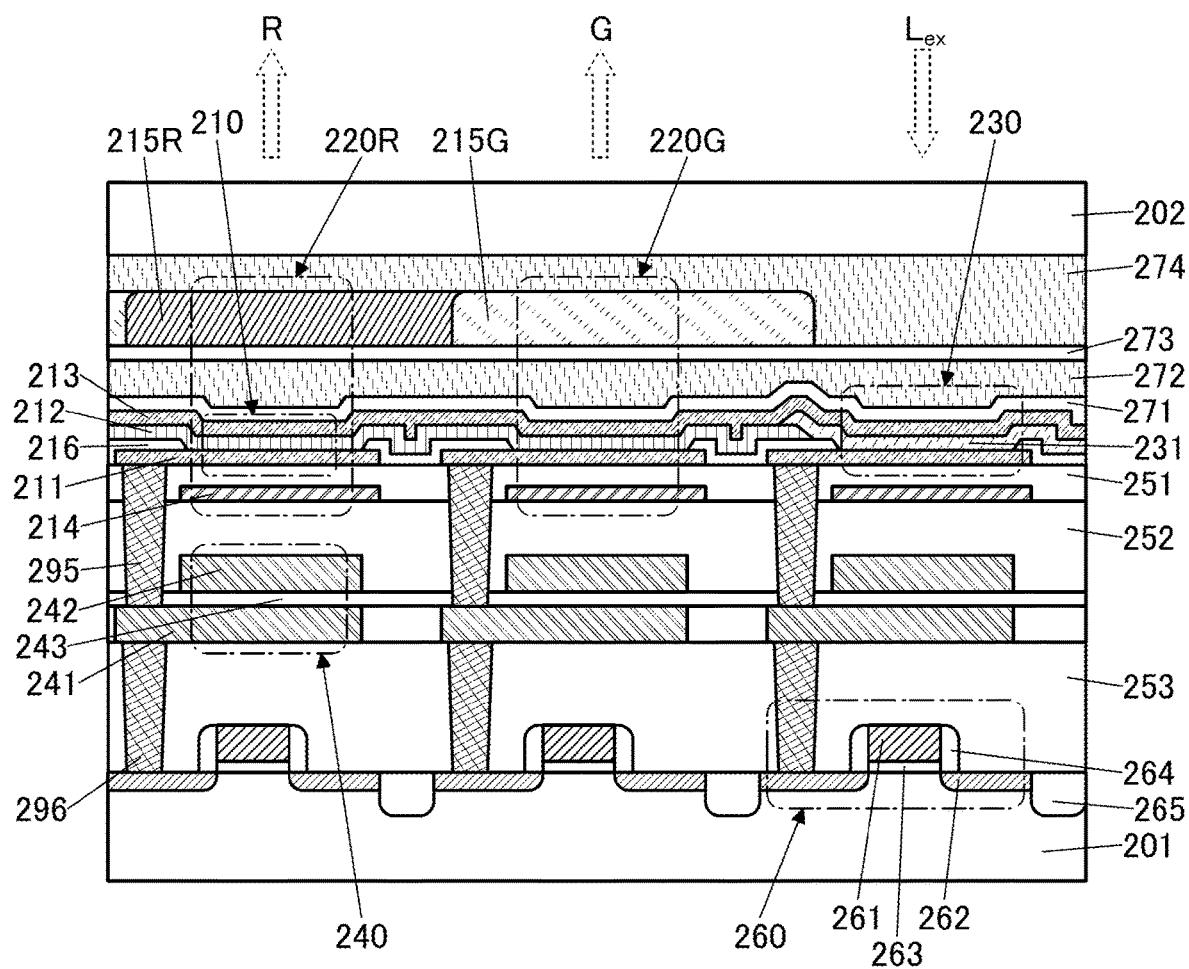
FIG. 8 is a diagram illustrating a structure example of a display device.

FIG. 8 is a schematic cross-sectional view of a display device 200A described below. The display device 200A mainly includes a substrate 201, a substrate 202, and a light-emitting unit 220R, a light-emitting unit 220G, a light-receiving element 230, a capacitor 240, a transistor 260, and the like sandwiched between the substrates.

The transistor 260 is a transistor whose channel is formed in the substrate 201. As the substrate 201, a semiconductor substrate such as a single crystal silicon substrate can be used, for example. The transistor 260 includes part of the substrate 201, a conductive layer 261, a pair of low-resistance regions 262, an insulating layer 263, an insulating layer 264, and the like. The conductive layer 261 functions as a gate electrode. The insulating layer 263 is positioned between the conductive layer 261 and part of the substrate 201 that functions as a channel formation region, and functions as a gate insulating layer. The low-resistance regions 262 are regions where the substrate 201 is doped with an impurity, and function as a source and a drain of the transistor 260. The insulating layer 264 is provided to cover a side surface of the conductive layer 261 and functions as a sidewall insulating layer.

An element isolation layer 265 is provided between two adjacent transistors 260 to be embedded in the substrate 201.

An insulating layer 253 is provided to cover the transistor 260, and the capacitor 240 is provided over the insulating layer 253.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode, and the insulating layer 243 functions as a dielectric.

The conductive layer 241 is electrically connected to one of the low-resistance regions 262 of the transistor 260 through a plug 296 provided in the insulating layer 253. The insulating layer 243 is provided to cover the conductive layer 241, and the conductive layer 242 is provided in a region overlapping with the conductive layer 241 with the insulating layer 243 therebetween.

An insulating layer 252 is provided to cover the capacitor 240, and the light-emitting unit 220R, the light-emitting unit 220G, and the light-receiving element 230 are provided over the insulating layer 252.

The light-emitting unit 220R includes a reflective layer 214, a light-emitting element 210, and a coloring layer 215R. The light-emitting unit 220G includes the reflective layer 214, the light-emitting element 210, and a coloring layer 215G. Here, an example is illustrated in which the light-emitting elements 210 having the same structure are used in the light-emitting unit 220R and the light-emitting unit 220G. In that case, the light-emitting elements 210 are preferably light-emitting elements emitting white light.

The light-emitting element 210 has a structure in which a conductive layer 211, an EL layer 212, and a conductive layer 213 are stacked in this order. The light-emitting element 210 is what is called a top-emission light-emitting element that emits light to the side opposite to the formation surface side. The conductive layer 211 and the conductive layer 213 preferably have light-transmitting properties. In that case, light emitted from the light-emitting element 210 to the substrate 201 side is reflected by the reflective layer 214 and emitted to the substrate 202 side.

Note that as a light-emitting element that can be used as the light-emitting element 210, a self-luminous element can be used, and an element whose luminance is controlled by current or voltage is included in the category. For example, an LED, an organic EL element, an inorganic EL element, or the like can be used. In particular, an organic EL element is preferably used.

The EL layer 212 includes at least a light-emitting layer. In addition to the light-emitting layer, the EL layer 212 may further include layers containing a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer 212, and an inorganic compound may also be contained. The layers included in the EL layer 212 can each be formed by a method such as an evaporation method (including a vacuum evaporation method), a transfer method, a printing method, an inkjet method, or a coating method.

When a voltage higher than the threshold voltage of the light-emitting element 210 is applied between a cathode and an anode, holes are injected to the EL layer 212 from the anode side and electrons are injected to the EL layer 212 from the cathode side. The injected electrons and holes are recombined in the EL layer 212 and a light-emitting substance contained in the EL layer 212 emits light.

In the case where a light-emitting element emitting white light is used as the light-emitting element 210, the EL layer 212 preferably contains two or more kinds of light-emitting substances. A white emission can be obtained by selecting light-emitting substances so that two or more light-emitting substances emit light of complementary colors, for example. For example, it is preferable to contain two or more out of light-emitting substances emitting light of R (red), G (green), B (blue), Y (yellow), O (orange), and the like or light-emitting substances emitting light containing two or more of spectral components of R, G, and B. A light-emitting element whose emission spectrum has two or more peaks in the wavelength range of a visible light region (e.g., 350 nm to 750 nm) is preferably employed. An emission spectrum of a material having a peak in a yellow wavelength range preferably has spectral components also in green and red wavelength ranges.

The EL layer 212 preferably has a structure in which a light-emitting layer containing a light-emitting material emitting light of one color and a light-emitting layer containing a light-emitting material emitting light of another color are stacked. For example, the plurality of light-emitting layers in the EL layer 212 may be stacked in contact with each other or may be stacked with a region not including any light-emitting material therebetween. For example, between a fluorescent layer and a phosphorescent layer, a region that contains the same material as the fluorescent layer or phosphorescent layer (for example, a host material or an assist material) and no light-emitting material may be provided. This facilitates the fabrication of the light-emitting element and reduces the drive voltage.

The light-emitting element 210 may be a single element including one EL layer or a tandem element in which a plurality of EL layers are stacked with a charge-generation layer therebetween.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

The light-emitting units in each of which a conductive film having a transmitting property and reflectivity is used as the conductive layer 213 may have what is called a microcavity structure. At this time, the optical length between the surface of the reflective layer 214 reflecting visible light and the conductive layer 213 having a transmitting property and reflectivity with respect to visible light is preferably adjusted to $m\lambda/2$ (m is a natural number) or the vicinity thereof, where $\lambda$ is the wavelength of light whose intensity is desired to be increased. In order to adjust the optical lengths in the light-emitting units, the thickness of the reflective layer 214, the thickness of the conductive layer 211, or the like can be different between the light-emitting units.

Light which is emitted from the light-emitting element 210 and has a wavelength other than a predetermined wavelength is absorbed by the coloring layer 215R in the light-emitting unit 220R, and is emitted to the outside as red light R, for example. Similarly, green light G is emitted from the light-emitting unit 220G to the outside, for example. Although not illustrated here, a light-emitting unit 220B emitting blue light is preferably included in the display device 200A.

Note that a structure may be employed in which the above-described quantum dot material is used for the coloring layer 215R and the coloring layer 215G. In the case of the above structure, color conversion (wavelength conversion) can be performed with the quantum dot material when light emitted from the light-emitting element 210 is blue. Such a structure is suitable because the light-emitting elements 210 do not need to be separately formed and thus the manufacturing cost can be reduced.

The light-receiving element 230 is an element that functions as a photodiode, receives external light Lex entering from the outside, and converts the external light into an electric signal. The light-receiving element 230 has a structure including the conductive layer 211, the conductive layer 213, and an active layer 231 provided therebetween.

The active layer 231 can have a stacked-layer structure in which a p-type semiconductor and an n-type semiconductor are stacked to form a pn junction; or a stacked-layer structure in which a p-type semiconductor, an i-type semiconductor, and an n-type semiconductor are stacked to form a pin junction, for example.

As the semiconductor used for the active layer 231, an inorganic semiconductor such as silicon or an organic semiconductor containing an organic compound can be used. In particular, the use of an organic semiconductor material is preferable, in which case the EL layer 212 of the light-emitting element 210 and the active layer 231 are easily formed by a vacuum evaporation method, and thus the same manufacturing apparatus can be used.

When an organic semiconductor material is used for the active layer 231, an electron-accepting organic semiconductor material such as fullerene (e.g., $C_{60}$ or $C_{70}$) or its derivative can be used as an n-type semiconductor material. As a p-type semiconductor material, an electron-donating organic semiconductor material such as copper(II) phthalocyanine (CuPc) or tetraphenyldibenzoperiflanthene (DBP) can be used. The active layer 231 may have a stacked-layer structure (a p-n stacked-layer structure) including an electron-accepting semiconductor material and an electron-donating semiconductor material, or a stacked-layer structure (a p-i-n stacked-layer structure) in which a bulk heterostructure layer formed by co-evaporation of an electron-accepting semiconductor material and an electron-donating semiconductor material is provided therebetween. Furthermore, a layer functioning as a hole-blocking layer or a layer functioning as an electron-blocking layer may be provided around (above or below) the p-n stacked-layer structure or the p-i-n stacked-layer structure, in order to inhibit dark current caused when light is not applied.

The reflective layer 214 is preferably provided on the substrate 201 side of the light-receiving element 230. The external light Lex passing through the light-receiving element 230 is reflected by the reflective layer 214 to the light-receiving element 230 side, so that the sensitivity of the light-receiving element 230 can be increased.

The reflective layer 214 is provided over the insulating layer 252. An insulating layer 251 is provided to cover the reflective layer 214, and the conductive layer 211 is provided over the insulating layer 251. The conductive layer 211 is electrically connected to the conductive layer 241 of the capacitor 240 through a plug 295 provided in the insulating layer 251 and the insulating layer 252. An insulating layer 216 having an opening that overlaps with the conductive layer 211 is provided over the conductive layer 211.

The EL layer 212 is provided over the conductive layer 211 in the light-emitting unit 220R and the light-emitting unit 220G. In the light-receiving element 230, the active layer 231 is provided over the conductive layer 211. In addition, the conductive layer 213 is provided to cover the EL layer 212 and the active layer 231. Accordingly, the conductive layer 213 can function as both the electrode of the light-emitting element 210 and the electrode of the light-receiving element 230.

Note that when a conductive film having a transmitting property and reflectivity is used as the conductive layer 213 to make the light-emitting units have the above-described microcavity structure, the sensitivity of the light-receiving element 230 might be decreased.

In that case, a conductive film having a light-transmitting property may be used as the conductive layer 213 and a conductive film having a transmitting property and reflectivity and the same pattern as that of the EL layer 212 may be separately formed between the EL layer 212 and the conductive layer 213 or over the conductive layer 213 to employ a structure in which the conductive film is not provided in the light-receiving element 230.

As illustrated in FIG. 8, a region where an end portion of the EL layer 212 and an end portion of the active layer 231 overlap with each other may be provided over the insulating layer 216.

In the display device 200A, an insulating layer 271, an insulating layer 272, and an insulating layer 273 are stacked to cover the light-emitting element 210 and the light-receiving element 230. These three insulating layers each function as a protective layer that prevents diffusion of impurities such as water into the light-emitting element 210 and the light-receiving element 230. As the insulating layer 271 and the insulating layer 273, it is preferable to use an inorganic insulating film with low moisture permeability, such as a silicon oxide film, a silicon nitride film, or an aluminum oxide film. As the insulating layer 272, an organic insulating film having a high light-transmitting property can be used. Using an organic insulating film as the insulating layer 272 can reduce the influence of uneven shape below the insulating layer 272, so that the formation surface of the insulating layer 273 can be a smooth surface. Accordingly, a defect such as a pinhole is unlikely to be generated in the insulating layer 273, leading to higher moisture permeability of the protective layer. Note that the structure of the protective layer covering the light-emitting element 210 and the light-receiving element 230 is not limited thereto, and a single layer or a two-layer structure may be employed or a stacked-layer structure of four or more layers may be employed.

The coloring layer 215R and the coloring layer 215G are provided over the insulating layer 273. Note that in the case where a filter for blocking part of light entering the light-receiving element 230 is provided, the filter can be provided over the insulating layer 273 like the coloring layer 215R or the like. As described above, the formation of the coloring layers (and the filter) over the insulating layer 273 facilitates alignment between the light-emitting element 210 and the coloring layers (or alignment between the filter and the light-receiving element 230) as compared with the case where the coloring layers (and the filter) are formed on the substrate 202 side and then the substrate 202 and the substrate 201 are attached to each other, for example, so that a display device having extremely high resolution can be obtained.

The display device 200A includes the substrate 202 on the viewing side. The substrate 202 and the substrate 201 are bonded to each other with a bonding layer 274. As the substrate 202, a substrate having a light-transmitting property such as a glass substrate, a quartz substrate, a sapphire substrate, or a plastic substrate can be used.

Such a structure enables a display device in which a display unit doubles as an imaging unit and which has high resolution to be obtained.

Structure Example 2

Figure 9:
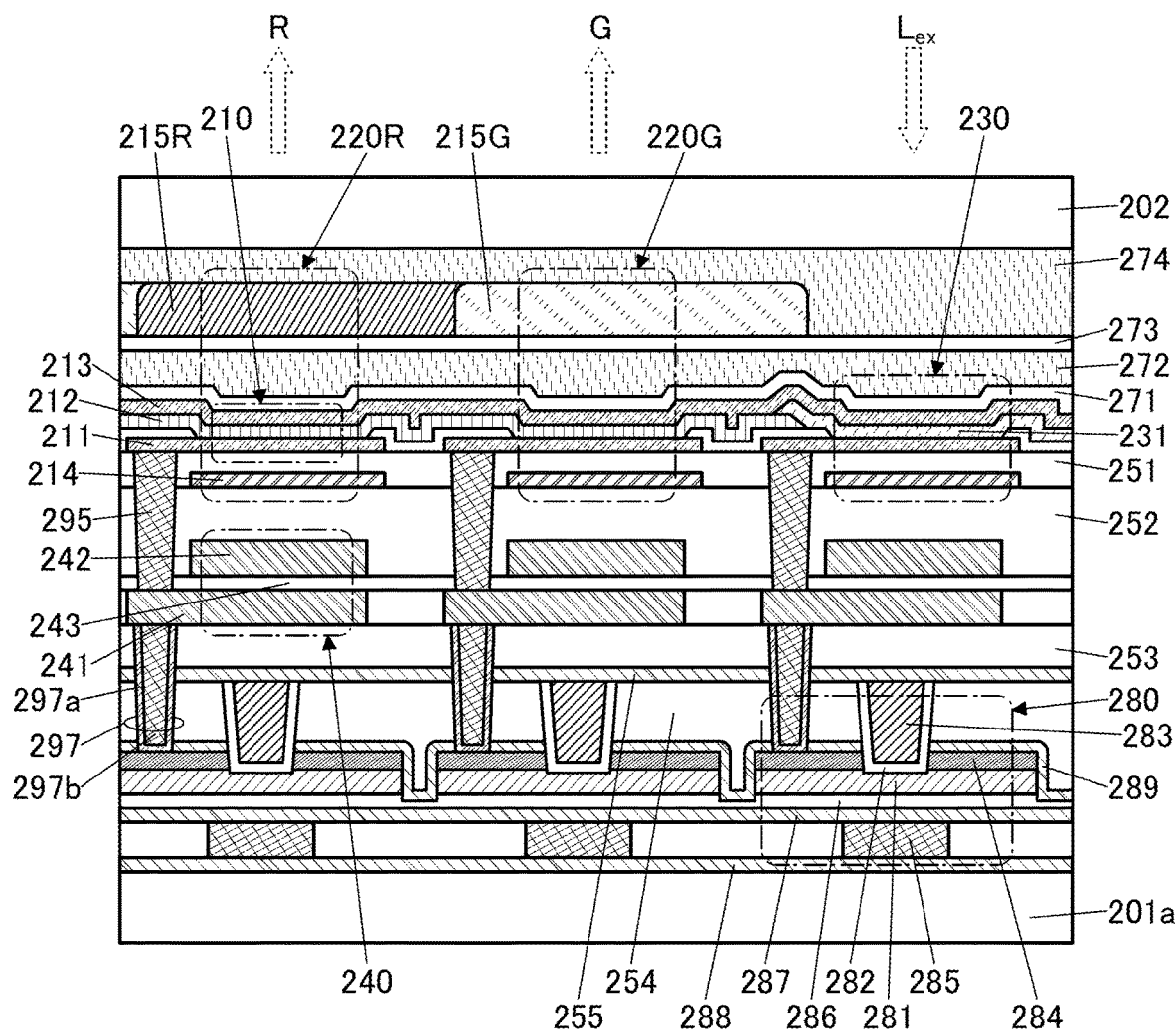
FIG. 9 is a diagram illustrating a structure example of a display device.

FIG. 9 is a schematic cross-sectional view of a display device 200B. A display device 200C is different from the display device 200A mainly in a transistor structure.

A transistor 280 is a transistor in which a metal oxide (also referred to as an oxide semiconductor) is used in a semiconductor where a channel is formed.

The transistor 280 includes a semiconductor layer 281, an insulating layer 282, a conductive layer 283, a conductive layer 284, a conductive layer 285, an insulating layer 286, an insulating layer 287, and the like.

An insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an SOI substrate can be used as a substrate 201a over which the transistor 280 is provided.

An insulating layer 288 is provided over the substrate 201a. The insulating layer 288 functions as a barrier layer that prevents diffusion of impurities such as water and hydrogen from the substrate 201a into the transistor 280 and diffusion of oxygen from the semiconductor layer 281 to the insulating layer 288 side. As the insulating layer 288, a film in which hydrogen or oxygen is less likely to be diffused than in a silicon oxide film, such as an aluminum oxide film, a hafnium oxide film, and a silicon nitride film, can be used, for example.

The conductive layer 285 is provided over the insulating layer 288, and the insulating layer 287 and the insulating layer 286 are provided to cover the conductive layer 285. The semiconductor layer 281 is provided over the insulating layer 286. The conductive layer 285 functions as a first gate electrode of the transistor 280, and part of the insulating layer 287 and part of the insulating layer 286 each function as a first gate insulating layer. As the insulating layer 286 in contact with the semiconductor layer 281, an oxide insulating film such as a silicon oxide film is preferably used. The insulating layer 287 between the insulating layer 286 and the conductive layer 285 is preferably formed using an insulating film functioning as a barrier layer, like the insulating layer 288.

The semiconductor layer 281 preferably includes a film of a metal oxide exhibiting semiconductor characteristics (an oxide semiconductor).

The pair of conductive layers 284 is provided over the semiconductor layer 281 to be apart from each other. The conductive layers 284 function as a source electrode and a drain electrode. An insulating layer 289 is provided to cover the semiconductor layer 281 and the conductive layer 284, and an insulating layer 254 is provided over the insulating layer 289. An opening reaching the semiconductor layer 281 is provided in the insulating layer 254, and the insulating layer 282 and the conductive layer 283 are embedded in the opening. An insulating layer 255 is provided to cover top surfaces of the insulating layer 254, the conductive layer 283, and the insulating layer 282.

The conductive layer 283 functions as a second gate electrode. The insulating layer 282 functions as a second gate insulating layer.

The insulating layer 289 and the insulating layer 255 are preferably formed using an insulating film functioning as a barrier layer, like the insulating layer 288 or the like. Covering the conductive layer 284 with the insulating layer 289 can prevent oxidation of the conductive layer 284 due to oxygen contained in the insulating layer 254.

A plug 297 electrically connected to the conductive layer 284 is provided in the opening provided in the insulating layer 253, the insulating layer 255, and the insulating layer 254. The plug 297 preferably includes a conductive layer 297a in contact with a side surface of the opening and a top surface of the conductive layer 284 and a conductive layer 297b embedded inside the conductive layer 297a. In this case, a conductive material in which hydrogen and oxygen are unlikely to be diffused is preferably used for the conductive layer 297a.

Structure Example 3

Figure 10:
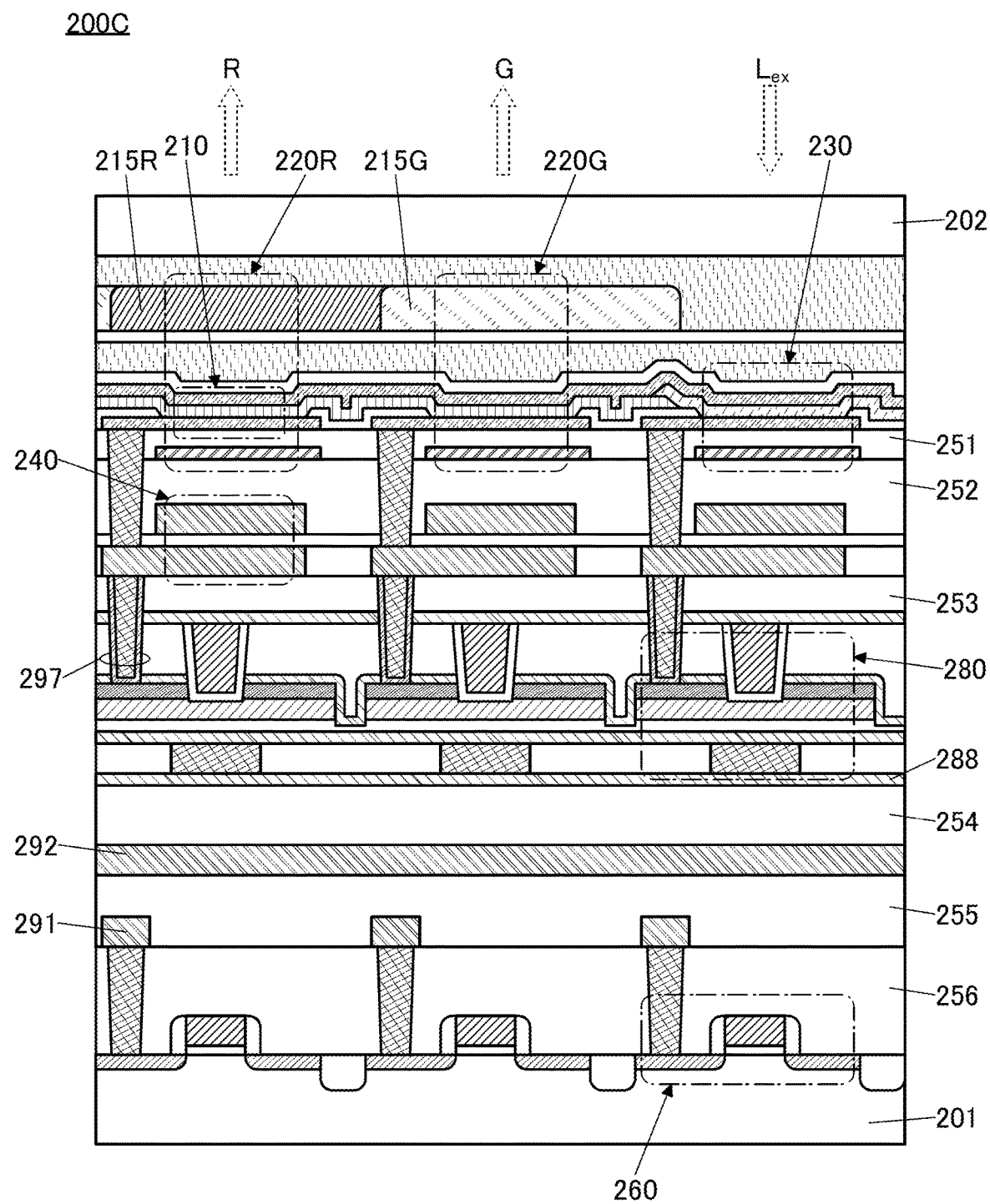
FIG. 10 is a diagram illustrating a structure example of a display device.

FIG. 10 shows a schematic cross-sectional view of the display device 200C. The display device 200C has a structure in which the transistor 260 whose channel is formed in the substrate 201 and the transistor 280 including a metal oxide in the semiconductor layer where the channel is formed are stacked.

An insulating layer 256 is provided to cover the transistor 260, and a conductive layer 291 functioning as a wiring is provided over the insulating layer 256. The insulating layer 255 is provided to cover the conductive layer 291, and a conductive layer 292 functioning as a wiring is provided over the insulating layer 255. The insulating layer 254 and the insulating layer 288 are provided to cover the conductive layer 292, and the transistor 280 is provided over the insulating layer 288. The insulating layer 253 is provided to cover the transistor 280, and the capacitor 240 is provided over the insulating layer 253. The capacitor 240 and the transistor 280 are electrically connected to each other through the plug 297.

The transistor 280 can be used as a transistor included in a pixel circuit. The transistor 260 can be used as a transistor included in a pixel circuit or a transistor included in a driver circuit (a gate line driver circuit, a source line driver circuit, or the like) for driving the pixel circuit. The transistor 260 and the transistor 280 can be used as transistors included in a variety of circuits such as an arithmetic circuit and a memory circuit.

With such a structure, not only the pixel circuit but also the driver circuit or the like can be placed directly under the light-emitting unit or the light-receiving element; thus, the display device can be downsized as compared with the case where the driver circuit is provided around a display region.

Note that although a structure in which one transistor 280 is provided between the transistor 260 and the light-emitting element 210 or the light-receiving element 230 is illustrated here, one embodiment of the present invention is not limited thereto, and two or more transistors 280 may be stacked. This can further reduce the area occupied by the pixel, resulting in higher resolution.

[Components]

Components such as a transistor that can be used in the display device will be described below.

[Transistor]

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate or bottom-gate transistor structure may be employed. Gate electrodes may be provided above and below a channel.

There is no particular limitation on the crystallinity of a semiconductor material used for the transistors, and any of an amorphous semiconductor, a single crystal semiconductor, and a semiconductor having crystallinity other than the single crystal semiconductor (a microcrystalline semiconductor, a polycrystalline semiconductor, or a semiconductor partly including crystal regions) may be used. It is preferable that a single crystal semiconductor or a semiconductor having crystallinity be used, in which case deterioration of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor using a metal oxide having a wider band gap and a lower carrier density than silicon has a low off-state current; thus, charges accumulated in a capacitor that is connected in series with the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

A metal oxide film with a low carrier density is used as the semiconductor layer. For example, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of Group 14 elements, is contained in the metal oxide contained in the semiconductor layer, oxygen vacancies are increased in the semiconductor layer, and the semiconductor layer becomes n-type. Thus, the concentration of silicon or carbon (concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to a metal oxide, in which case the off-state current of the transistor might be increased. Thus, the concentration of alkali metal or alkaline earth metal of the semiconductor layer, which is obtained by secondary ion mass spectrometry, is set to lower than or equal to $1\times10^{18}$ atoms/cm$^3$, preferably lower than or equal to $2\times10^{16}$ atoms/cm$^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to have normally-on characteristics. Hence, the nitrogen concentration obtained by secondary ion mass spectrometry is preferably set to lower than or equal to $5\times10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

The aforementioned non-single-crystal oxide semiconductor or CAC-OS can be suitably used for a semiconductor layer of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

<Composition of CAC-OS>

The composition of a CAC (Cloud-Aligned Composite)-OS that can be used in a transistor disclosed in one embodiment of the present invention will be described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (of the CAC-OS, an In—Ga—Zn oxide may be particularly referred to as CAC-IGZO) has a composition (hereinafter, also referred to as cloud-like composition) in which materials are separated into indium oxide (hereinafter, InO$_{X1}$ (X1 is a real number greater than 0)) or indium zinc oxide (hereinafter, In$_{X2}$Zn$_{Y2}$O$_{Z2}$ (X2, Y2, and Z2 are real numbers greater than 0)), and gallium oxide (hereinafter, GaO$_{X3}$ (X3 is a real number greater than 0)) or gallium zinc oxide (hereinafter, Ga$_{X4}$Zn$_{Y4}$O$_{Z4}$ (X4, Y4, and Z4 are real numbers greater than 0)) to form a mosaic pattern, and InO$_{X1}$ or In$_{X2}$Zn$_{Y2}$O$_{Z2}$ forming the mosaic pattern is evenly distributed in the film.

That is, the CAC-OS is a composite metal oxide having a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to the element M in a second region, the first region has higher In concentration than the second region.

Note that IGZO is a common name, which may specify a compound containing In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

Meanwhile, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region containing GaO$_{X3}$ as a main component and the region containing In$_{X2}$Zn$_{Y2}$O$_{Z2}$ or InO$_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component are observed in part of a CAC-OS and nanoparticle regions containing In as a main component are observed in part of the CAC-OS, and these nanoparticle regions are randomly dispersed to form a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, and for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (μ) can be achieved.

By contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, the use of the transistor in a signal line driver circuit included in the display device (particularly in a demultiplexer connected to an output terminal of a shift register included in a signal line driver circuit) can reduce the number of wirings connected to the display device.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display unit in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As silicon, amorphous silicon may be used but silicon having crystallinity is particularly preferably used. For example, microcrystalline silicon, polycrystalline silicon, or single crystal silicon are preferably used. In particular, polycrystalline silicon can be formed at a temperature lower than that for single crystal silicon and has higher field-effect mobility and higher reliability than amorphous silicon.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

The above is the description of the components.

[Structure Example of Display Module]

A structure example of a display module including the display device of one embodiment of the present invention will be described below.

Figure 11A:
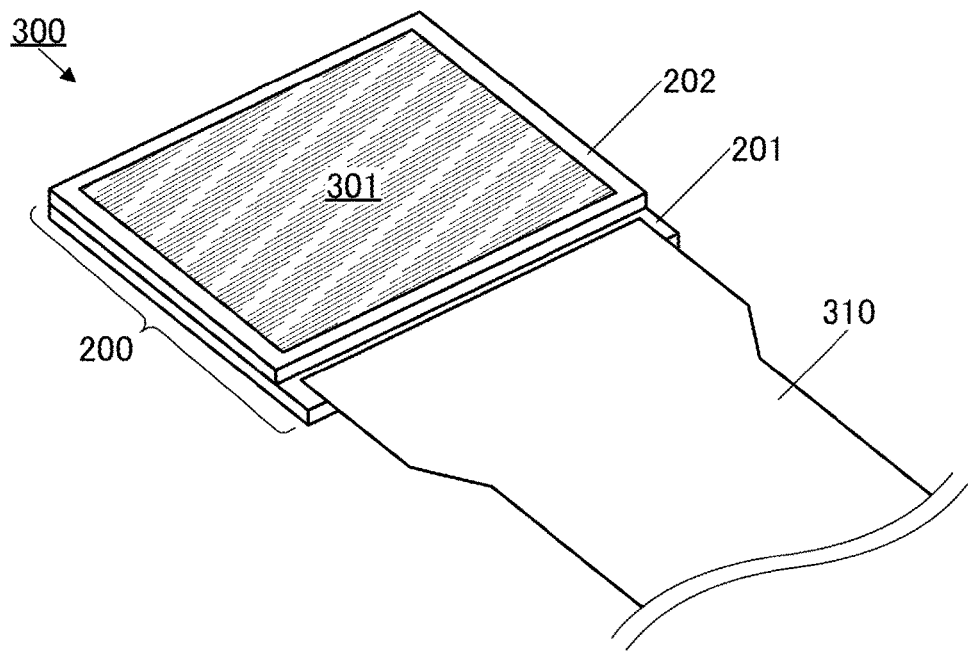
FIG. 11(A) and FIG. 11(B) are diagrams illustrating a structure example of a display module.

FIG. 11(A) is a schematic perspective view of a display module 300. The display module 300 includes a display device 200 and an FPC 310. Any of the display device 200A to the display device 200C and the like described above can be used as the display device 200.

The display module 300 includes the substrate 201 and the substrate 202. A display unit 301 is also included on the substrate 202 side. The display unit 301 is a region of the display module 300 where an image is displayed and is a region where light emitted from pixels provided in a pixel portion 304 described later can be seen.

The display unit 301 can also function as a light-receiving unit. That is, the display module 300 can detect light entering the display unit 301 and output the light as an electric signal to the outside through the FPC 310.

Figure 11B:
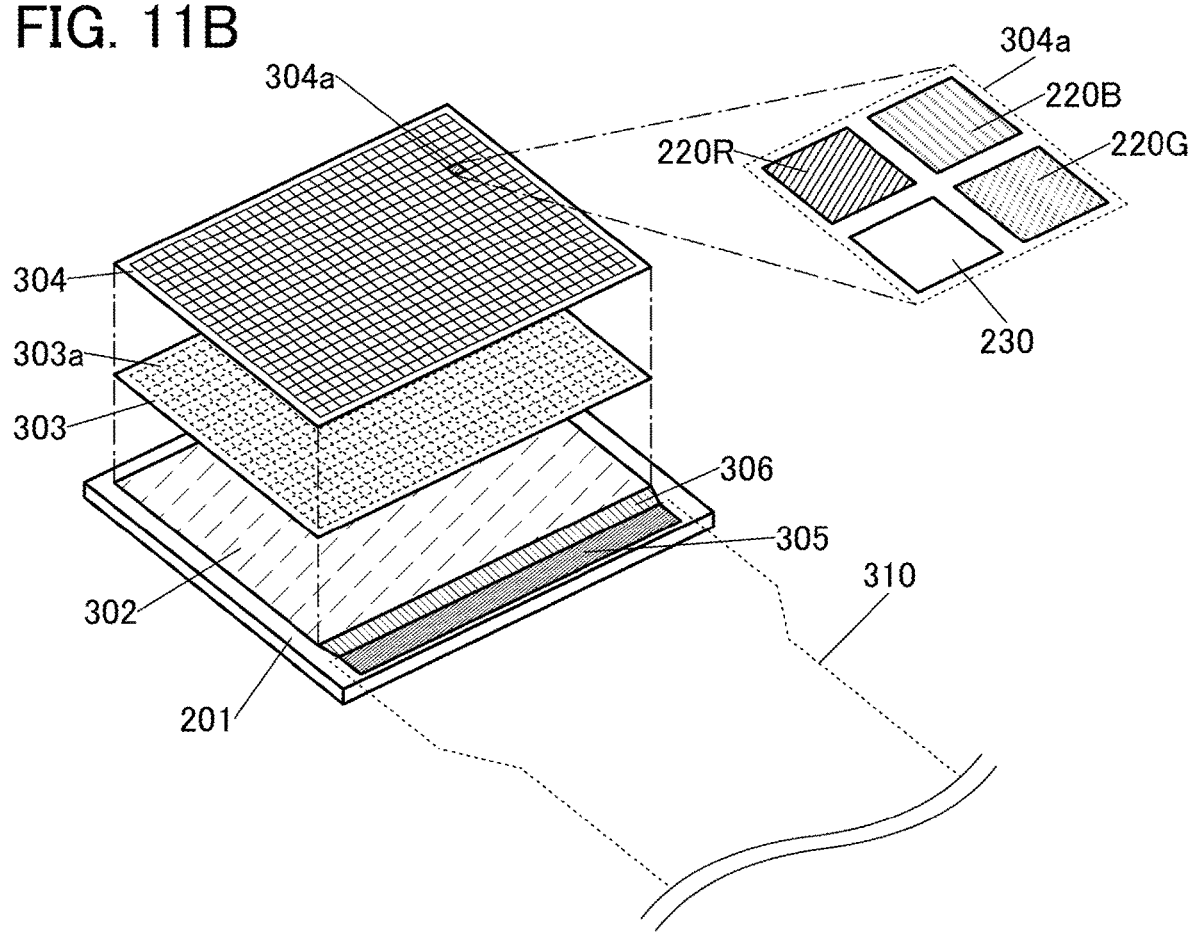

FIG. 11(B) illustrates a perspective view schematically illustrating a structure on the substrate 201 side. The substrate 201 has a structure in which a circuit portion 302, a pixel circuit portion 303 over the circuit portion 302, and the pixel portion 304 over the pixel circuit portion 303 are stacked. Note that the pixel circuit portion 303 may have a structure including two or more layers. In addition, a terminal portion 305 for connection to the FPC 310 is included in a portion not overlapping with the pixel portion 304 over the substrate 201. The terminal portion 305 and the circuit portion 302 are electrically connected to each other through a wiring portion 306 formed of a plurality of wirings.

The pixel portion 304 includes a plurality of pixels 304a arranged in a matrix. An enlarged view of one pixel 304a is illustrated on the right side of FIG. 11(B). The pixel 304a includes the light-emitting unit 220R, the light-emitting unit 220G, the light-emitting unit 220B, and the light-receiving element 230.

The pixel circuit portion 303 includes a plurality of pixel circuits 303a arranged in a matrix. One pixel circuit 303a includes a circuit controlling light emission from the three light-emitting units included in one pixel 304a and a circuit controlling the operation of the light-receiving element 230. One pixel 304a may include three circuits controlling light emission from the respective light-emitting units and a circuit controlling the operation of the light-receiving element 230.

For the structure of the pixel circuit, for example, refer to the circuit described in Embodiment 3 above.

The circuit portion 302 includes a circuit for driving the pixel circuits 303a in the pixel circuit portion 303. For example, a gate line driver circuit and a source line driver circuit are preferably included.

The circuit portion 302 preferably includes a reading circuit that reads an output signal corresponding to the amount of light detected by the light-receiving element 230 and amplifies or converts the output signal to be output. For example, a sense amplifier or the like can be included.

Note that the circuit portion 302 may include an arithmetic circuit, a memory circuit, a power supply circuit, and the like in addition to the above components.

The FPC 310 functions as a wiring for supplying a video signal, a sensor driving signal, a power supply potential, or the like to the circuit portion 302 from the outside and a wiring for outputting a sensor signal to the outside. In addition, an IC may be mounted on the FPC 310.

The display module 300 can have a structure in which the pixel circuit portion 303, the circuit portion 302, and the like are stacked below the pixel portion 304; thus, the aperture ratio (the effective display area ratio and the effective light-receiving area ratio) of the display unit 301 can be significantly high. For example, the aperture ratio of the display unit 301 can be greater than or equal to 40% and less than 100%, preferably greater than or equal to 50% and less than or equal to 95%, further preferably greater than or equal to 60% and less than or equal to 95%. Furthermore, the pixels 304a can be arranged extremely densely and thus the display unit 301 can have extremely high resolution. For example, the pixels 304a are preferably arranged in the display unit 301 with a resolution greater than or equal to 500 ppi, preferably greater than or equal to 1000 ppi, further preferably greater than or equal to 2000 ppi, still further preferably greater than or equal to 3000 ppi, yet further preferably greater than or equal to 5000 ppi, yet still further preferably greater than or equal to 6000 ppi, and less than or equal to 20000 ppi or less than or equal to 30000 ppi.

Such a display module 300 has extremely high resolution, and thus can be suitably used for a device for VR such as a head-mounted display or a glasses-type device for AR. For example, even in the case of a structure in which the display unit of the display module 300 is seen through a lens, pixels of the extremely-high-resolution display unit 301 included in the display module 300 are not seen when the display unit is enlarged by the lens, so that display providing a high sense of immersion can be performed. Without limitation to the above, the display module 300 can also be suitably used for an electronic device having a relatively small display unit. For example, the display module 300 can be suitably used in a display unit of a wearable electronic device such as a smart watch.

The display module 300 has a function of detecting received light in addition to a function of displaying an image. Thus, light reflected by part of the user's face can be detected and its data can be output to the outside. At this time, light from a display element provided in the pixel 304a can be used as a light source, which enables detailed data to be obtained even in a dark environment.

At least part of this embodiment can be implemented in combination with the other embodiments described in this specification as appropriate.

Embodiment 5

In this embodiment, display devices that can be used for the data processing device or the like of one embodiment of the present invention will be described.

Structure Example

Figure 12A:
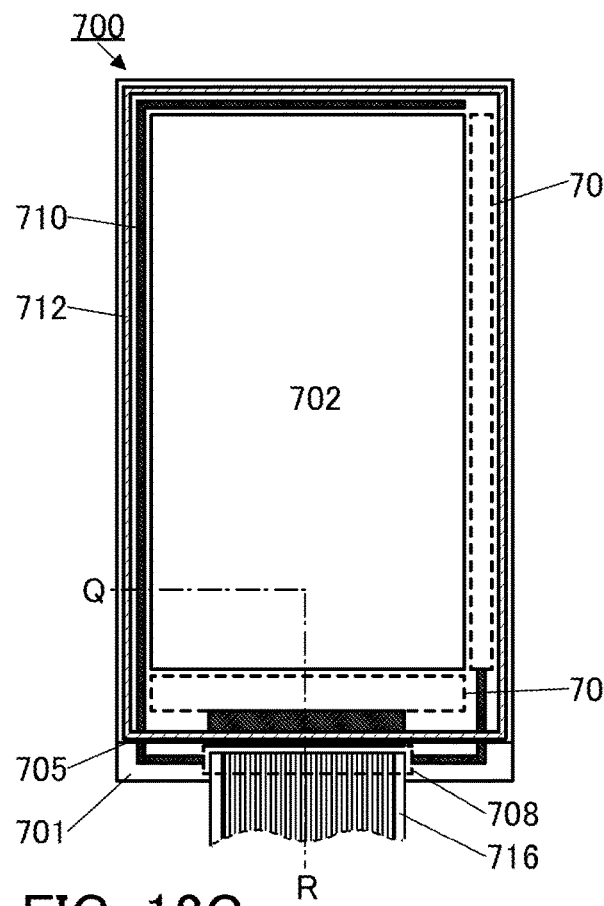
FIG. 12(A), FIG. 12(B), and FIG. 12(C) are diagrams illustrating structure examples of display devices.

FIG. 12(A) is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

Any of the transistors described in Embodiment 4 can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

Figure 12B:
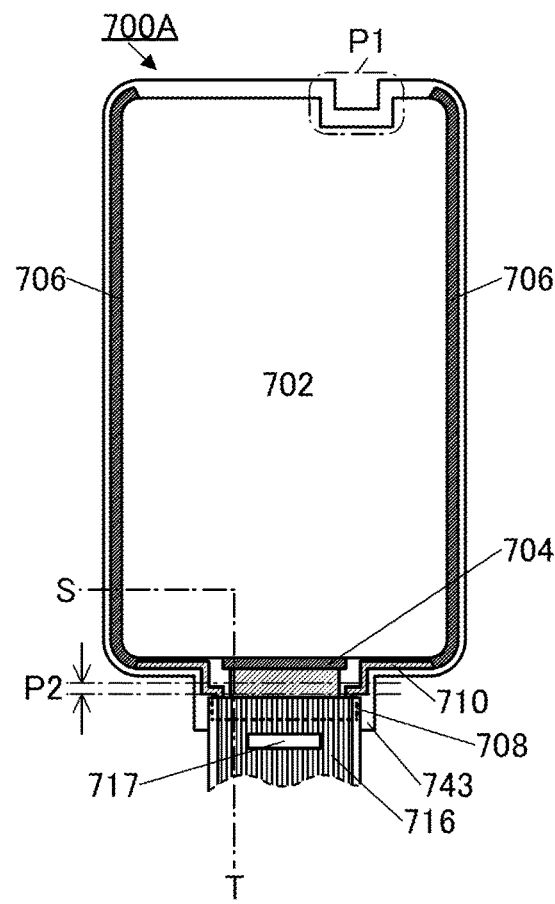

A display device 700A illustrated in FIG. 12(B) is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as illustrated in a region P1 in FIG. 12(B). A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 12(B). When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

Figure 12C:
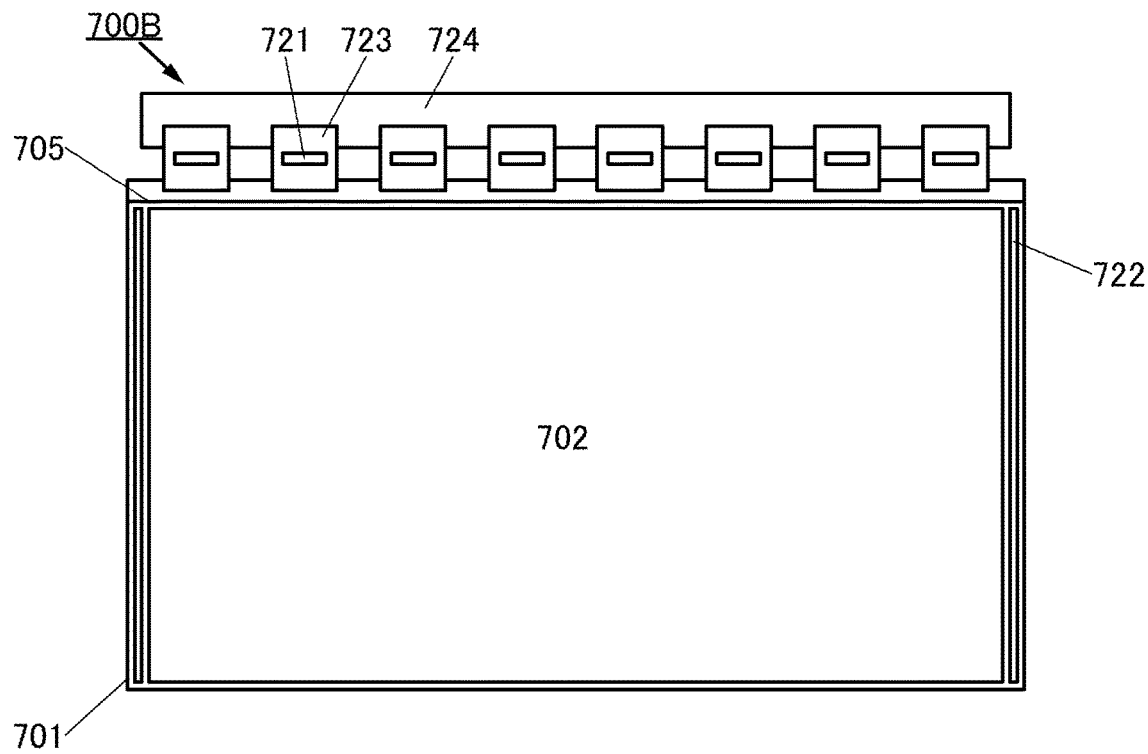

A display device 700B illustrated in FIG. 12(C) is a display device that can be suitably used for an electronic device with a large screen. For example, the display device 700B can be suitably used for a television device, a monitor device, a personal computer (including a notebook type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the substrate 701. Thus, an electronic device with a narrow bezel can be provided.

With such a structure, a large-size and high-resolution display device can be provided. For example, use in a display device with a diagonal screen size of 30 inches or more, 40 inches or more, 50 inches or more, or 60 inches or more is possible. Furthermore, a display device with extremely high resolution such as 4K2K or 8K4K can be provided.

Cross-Sectional Structure Example

Figure 13:
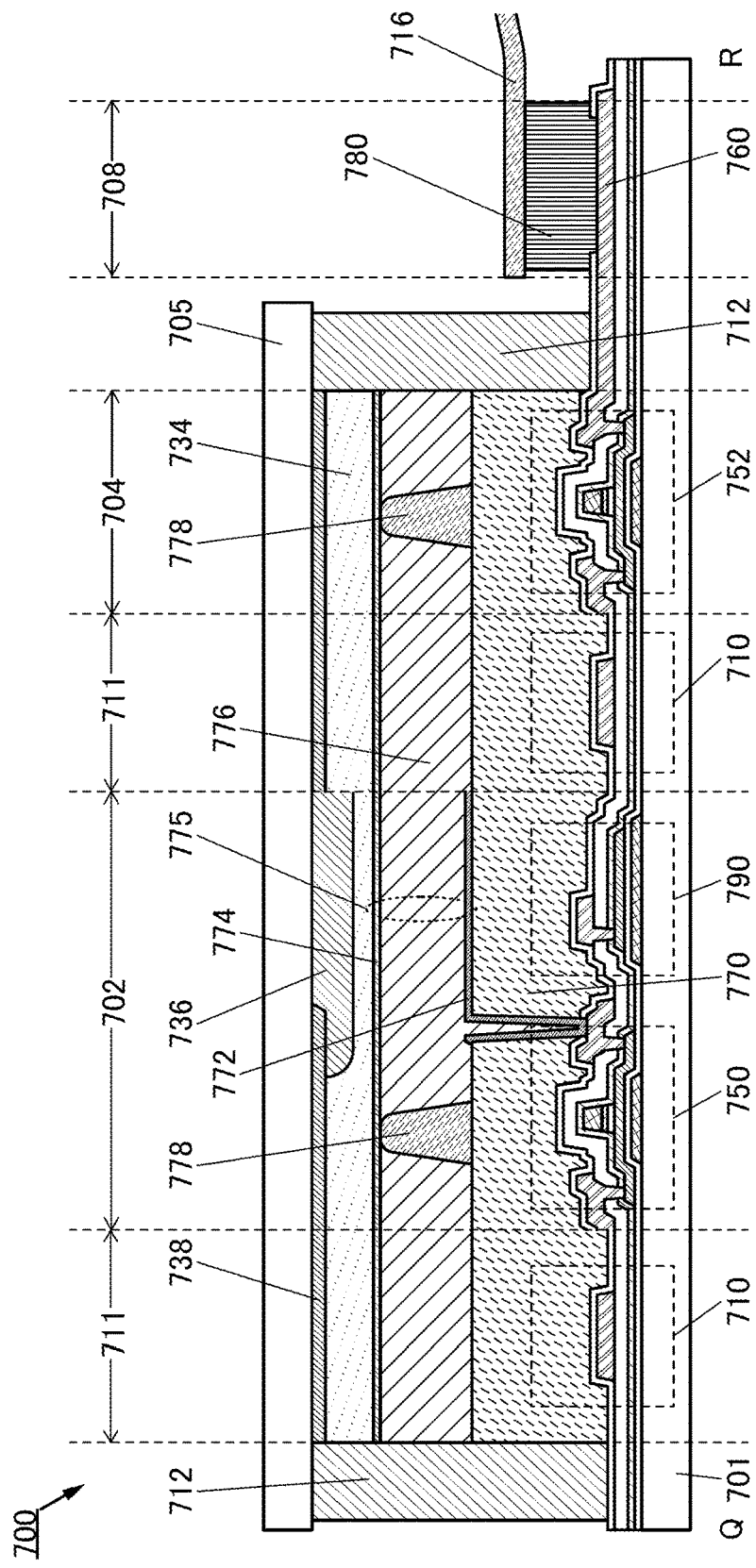
FIG. 13 is a diagram illustrating a structure example of a display device.
Figure 14:
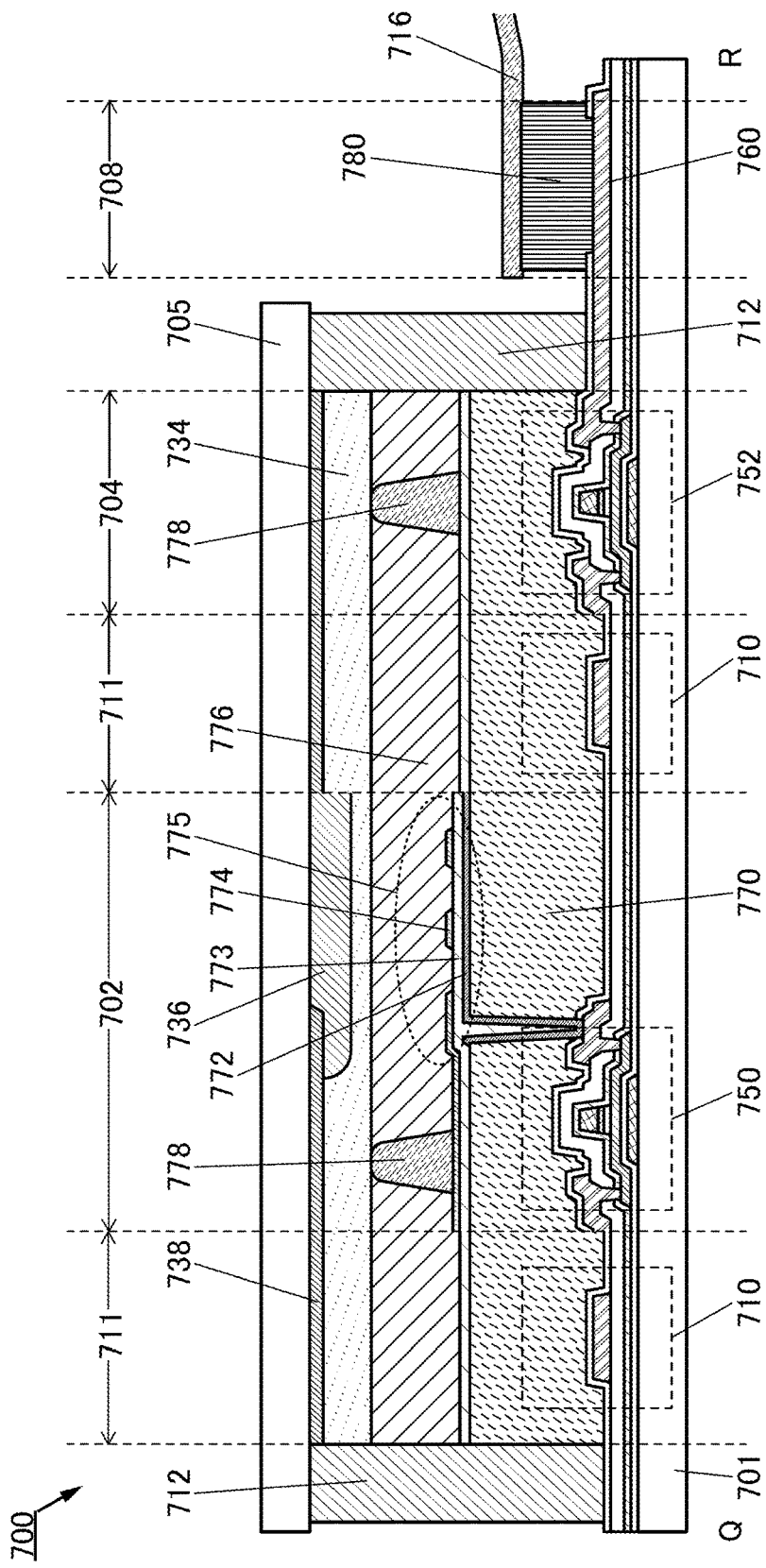
FIG. 14 is a diagram illustrating a structure example of a display device.
Figure 15:
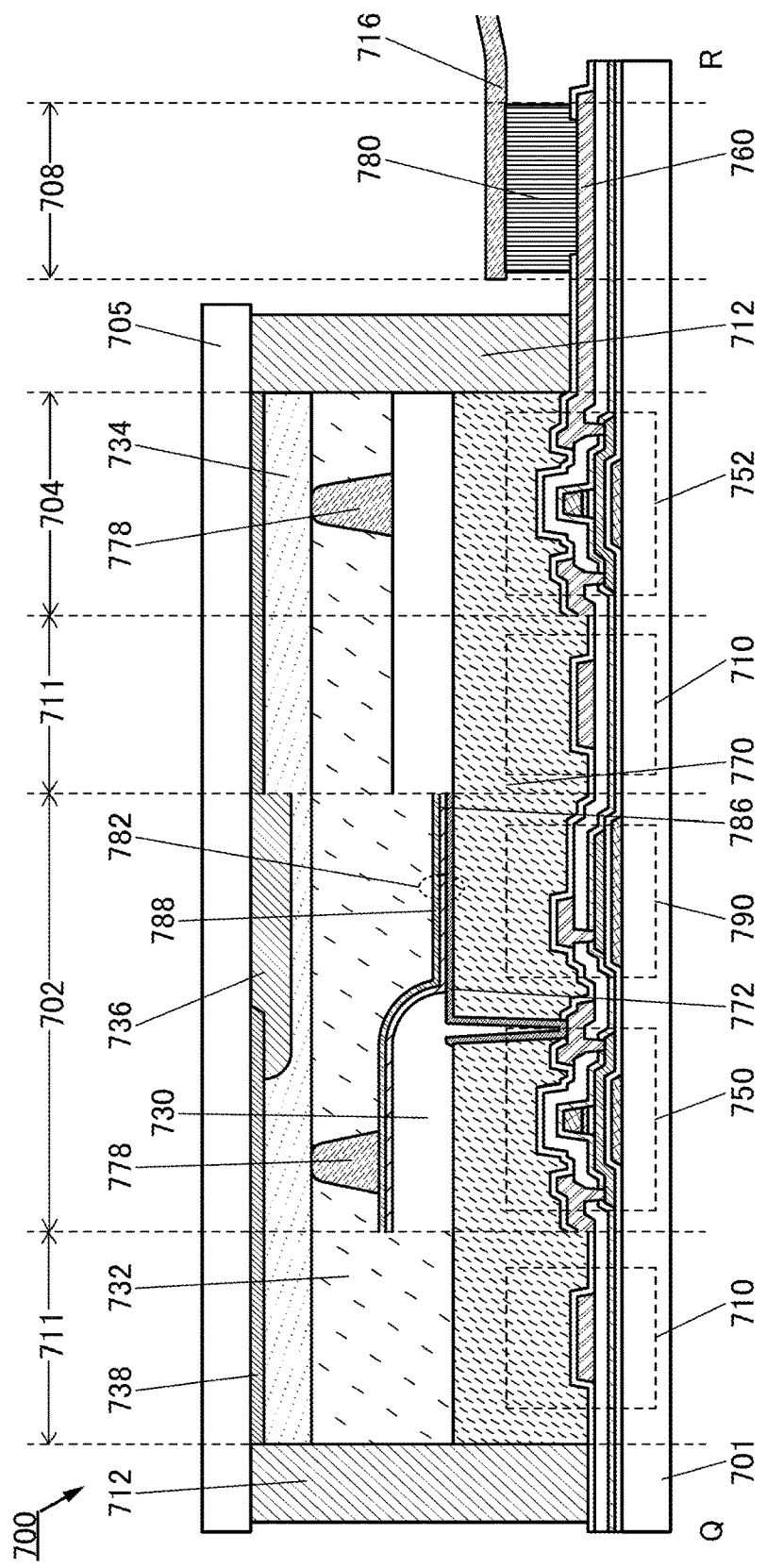
FIG. 15 is a diagram illustrating a structure example of a display device.
Figure 16:
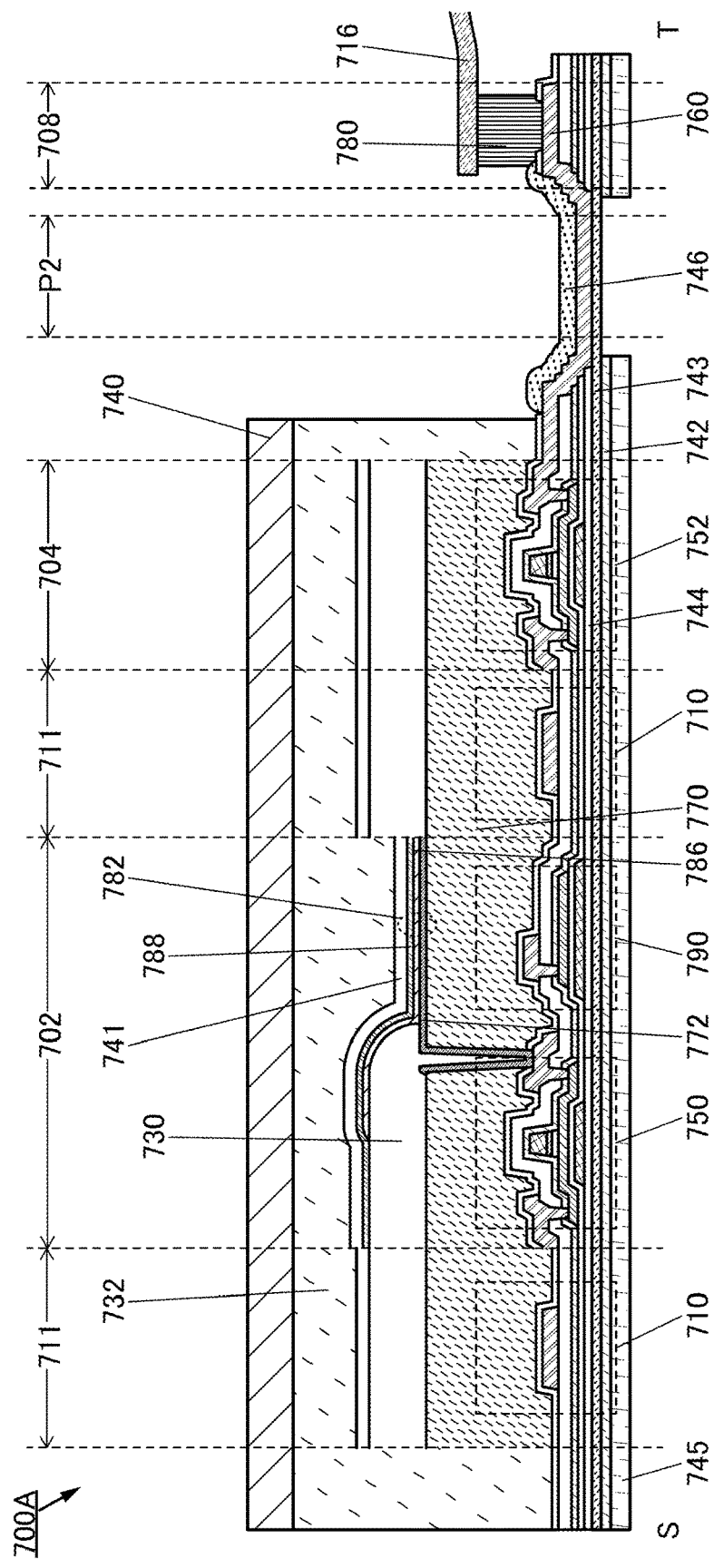
FIG. 16 is a diagram illustrating a structure example of a display device.

Structures using a liquid crystal element as a display element and structures using an EL element will be described below with reference to FIG. 13 to FIG. 16. Note that FIG. 13 to FIG. 15 are cross-sectional views taken along the dashed-dotted line Q-R in FIG. 12(A). FIG. 16 is a cross-sectional view taken along the dashed-dotted line S-T in the display device 700A in FIG. 12(B). FIG. 13 and FIG. 14 are each a structure using a liquid crystal element as a display element, and FIG. 15 and FIG. 16 are each a structure using an EL element.

<Description of Common Portions in Display Devices>

Display devices in FIG. 13 to FIG. 16 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 14 illustrates a case where the capacitor 790 is not provided.

The transistor 750 and the transistor 752 are each a transistor using an oxide semiconductor for a semiconductor layer in which a channel is formed. Note that one embodiment of the present invention is not limited thereto, and a transistor using silicon (amorphous silicon, polycrystalline silicon, or single crystal silicon) for a semiconductor layer can also be used.

The transistor used in this embodiment includes a highly purified oxide semiconductor film in which formation of oxygen vacancies is suppressed. The transistor can have low off-state current. Accordingly, an electric signal such as an image signal can be held for a longer period, and the interval between writes of an image signal or the like can be set longer. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 13, FIG. 15, and FIG. 16 includes a lower electrode formed by processing the same film as a first gate electrode included in the transistor 750 and an upper electrode formed by processing the same metal oxide as the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

As the transistor 750 included in the pixel portion 702 and the transistor 752 included in the source driver circuit portion 704, transistors having different structures may be used. For example, a top-gate transistor may be used as one of the transistors 750 and 752, and a bottom-gate transistor may be used as the other. Note that the same can be said for the gate driver circuit portion 706, as the source driver circuit portion 704.

The signal line 710 is formed using the same conductive film as the source electrodes, the drain electrodes, and the like of the transistor 750 and the transistor 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistors 750 and 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

<Structure Example of Display Device Using Liquid Crystal Element>

The display device 700 illustrated in FIG. 13 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material including indium, zinc, tin, or the like is preferably used. As a reflective material, for example, a material including aluminum, silver, or the like is preferably used.

When a reflective material is used for the conductive layer 772, the display device 700 is a reflective liquid crystal display device. When a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided so that the liquid crystal element 775 is placed therebetween.

The display device 700 in FIG. 14 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 14, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 13 and FIG. 14, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optical Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

<Display Device Using Light-Emitting Element>

The display device 700 illustrated in FIG. 15 includes a light-emitting element 782. The light-emitting element 782 includes the conductive layer 772, an EL layer 786, and a conductive film 788. The EL layer 786 contains an organic compound or an inorganic compound such as quantum dots.

Examples of materials that can be used for an organic compound include a fluorescent material and a phosphorescent material. Examples of materials that can be used for quantum dots include a colloidal quantum dot material, an alloyed quantum dot material, a core-shell quantum dot material, and a core quantum dot material.

In the display device 700 illustrated in FIG. 15, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 16 illustrates a structure of a display device suitably applicable to a flexible display. FIG. 16 is a cross-sectional view taken along the dashed-dotted line S-T in the display device 700A in FIG. 12(B).

The display device 700A in FIG. 16 has a structure in which a support substrate 745, a bonding layer 742, the resin layer 743, and an insulating layer 744 are stacked instead of the substrate 701 in FIG. 15. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 16 includes a protective layer 740 instead of the substrate 705 in FIG. 15. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 16 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When a structure is employed in which an inorganic insulating film is not provided if possible in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

<Structure Example of Display Device Provided with Input Device>

An input device may be provided in the display device 700 illustrated in FIG. 13 to FIG. 16. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include what is called an in-cell touch panel in which an input device is formed between a pair of substrates, what is called an on-cell touch panel in which an input device is formed over the display device 700, and what is called an out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 6

In this embodiment, structure examples of electronic devices each of which includes a display device and can be used for the data processing device of one embodiment of the present invention will be described.

The display device and the display module of one embodiment of the present invention can be used for a display unit of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display device and the display module of one embodiment of the present invention can have high resolution, and thus can be suitably used for an electronic device having a relatively small display unit. Such an electronic device can be suitably used for, for example, a watch-type or bracelet-type information terminal device (wearable device) and a wearable device worn on a head, such as a device for VR such as a head-mounted display and a glasses-type device for AR.

Figure 17A:
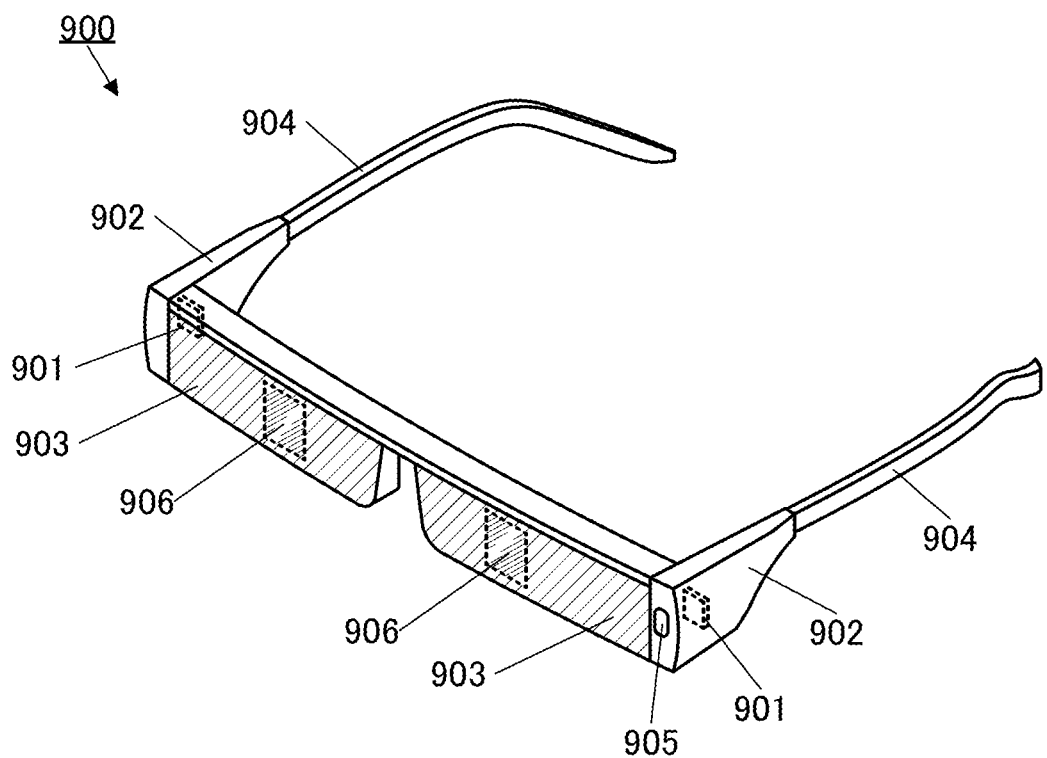
FIG. 17(A) and FIG. 17(B) are diagrams illustrating a structure example of an electronic device.

FIG. 17(A) is a perspective view of a glasses-type electronic device 900. The electronic device 900 includes a pair of display panels 901, a pair of housings 902, a pair of optical members 903, a pair of mounting portions 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of capturing an image in addition to a function of displaying an image. In that case, the electronic device 900 can receive light incident on the display panel 901 through the optical member 903, and convert the light into an electric signal to be output. Thus, an image of the user's eye or the eye and its vicinity can be captured and the image can be output to the outside or an arithmetic unit included in the electronic device 900 as image data.

One housing 902 is provided with a camera 905 capable of capturing an image of what lies in front thereof. Although not illustrated, one of the housings 902 is provided with a wireless receiver or a connector to which a cable can be connected, whereby a video signal or the like can be supplied to the housing 902. Furthermore, when the housing 902 is provided with an acceleration sensor such as a gyroscope sensor, the orientation of the user's head can be detected and an image corresponding to the orientation can be displayed on the display region 906. Moreover, the housing 902 is preferably provided with a battery. The battery can be charged with or without a wire.

Figure 17B:
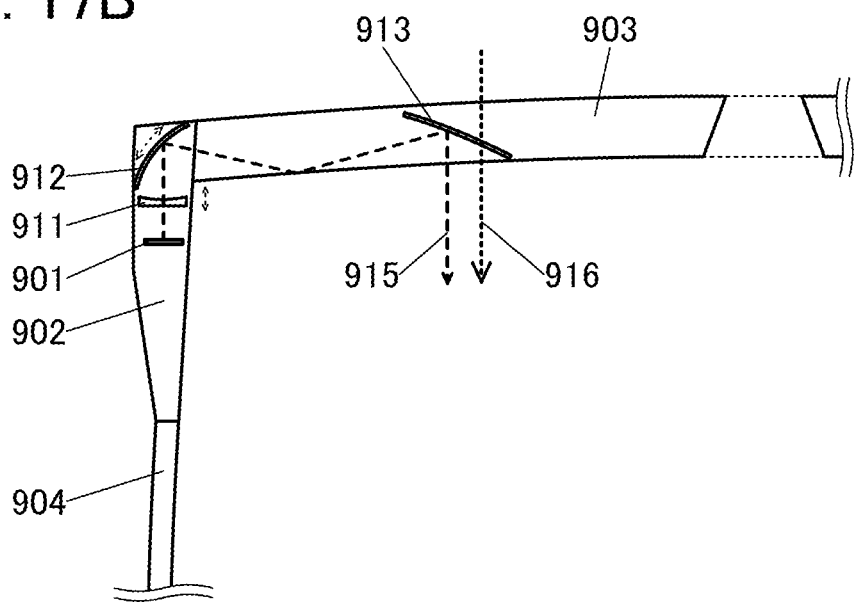

Next, a method for projecting an image on the display region 906 of the electronic device 900 is described with reference to FIG. 17(B). The display panel 901, a lens 911, and a reflective plate 912 are provided in the housing 902. A reflective surface 913 functioning as a half mirror is provided in a portion corresponding to the display region 906 of the optical member 903.

Light 915 emitted from the display panel 901 passes through the lens 911 and is reflected by the reflective plate 912 to the optical member 903 side. In the optical member 903, the light 915 is fully reflected repeatedly by end surfaces of the optical member 903 and reaches the reflective surface 913, whereby an image is projected on the reflective surface 913. Accordingly, the user can see both the light 915 reflected by the reflective surface 913 and transmitted light 916 that passes through the optical member 903 (including the reflective surface 913).

FIG. 17 shows an example in which the reflective plate 912 and the reflective surface 913 each have a curved surface. This can increase optical design flexibility and reduce the thickness of the optical member 903, compared to the case where they have flat surfaces. Note that the reflective plate 912 and the reflective surface 913 may have flat surfaces.

The reflective plate 912 can use a component having a mirror surface, and preferably has high reflectivity. As the reflective surface 913, a half mirror utilizing reflection of a metal film may be used, but the use of a prism utilizing total reflection or the like can increase the transmittance of the transmitted light 916.

Here, the housing 902 preferably includes a mechanism for adjusting the distance and angle between the lens 911 and the display panel 901. This enables focus adjustment, zooming in/out of an image, or the like. One or both of the lens 911 and the display panel 901 is configured to be movable in the optical-axis direction, for example.

The housing 902 preferably includes a mechanism capable of adjusting the angle of the reflective plate 912. The position of the display region 906 where images are displayed can be changed by changing the angle of the reflective plate 912. Thus, the display region 906 can be placed at the optimal position in accordance with the position of the user's eye.

The display device or the display module of one embodiment of the present invention can be used for the display panel 901. Thus, the electronic device 900 can perform display with extremely high resolution.

Figure 18A:
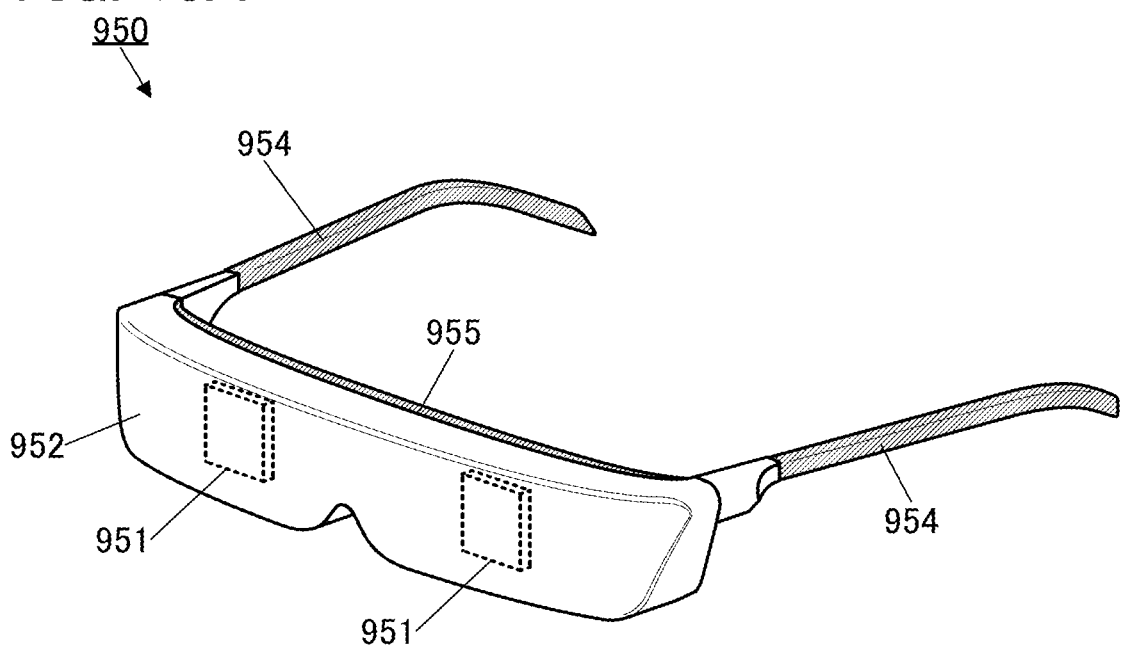
FIG. 18(A) and FIG. 18(B) are diagrams illustrating a structure example of an electronic device.
Figure 18B:
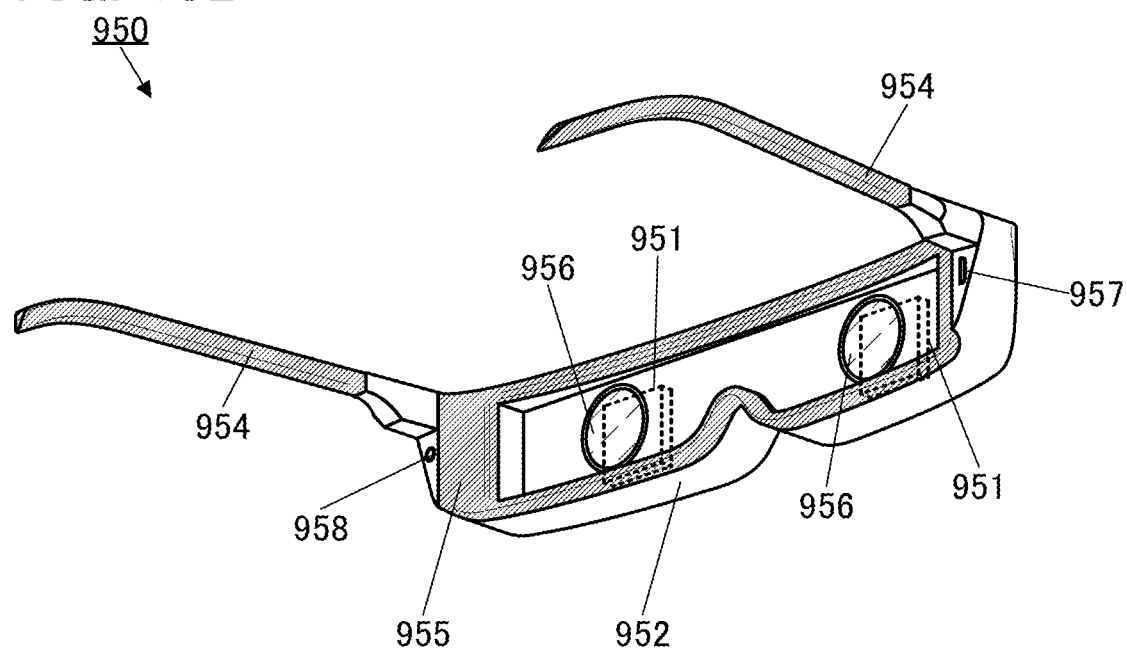

FIG. 18(A) and FIG. 18(B) illustrate perspective views of a goggle-type electronic device 950. FIG. 18(A) is a perspective view illustrating the front surface, the top surface, and the left side surface of the electronic device 950, and FIG. 18(B) is a perspective view illustrating the back surface, the bottom surface, and the right side surface of the electronic device 950.

The electronic device 950 includes a pair of display panels 951, a housing 952, a pair of mounting portions 954, a cushion 955, a pair of lenses 956, and the like. The pair of display panels 951 is positioned to be seen through the lenses 956 inside the housing 952.

The electronic device 950 is an electronic device for VR. A user wearing the electronic device 950 can see an image displayed on the display panels 951 through the lenses 956. Furthermore, when the pair of display panels 951 displays different images, three-dimensional display using parallax can be performed.

An input terminal 957 and an output terminal 958 are provided on the back surface side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

In addition, the housing 952 preferably includes a mechanism by which the left and right positions of the lenses 956 and the display panels 951 can be adjusted to the optimal positions in accordance with the positions of the user's eyes. In addition, the housing 952 preferably includes a mechanism for adjusting focus by changing the distance between the lens 956 and the display panel 951.

The display device or the display module of one embodiment of the present invention can be used for the display panel 951. Thus, the electronic device 950 can perform display with extremely high resolution. This enables a user to feel high sense of immersion.

The cushion 955 is a portion in contact with the user's face (forehead, cheek, or the like). The cushion 955 is in close contact with the user's face, so that light leakage can be prevented, which further increases the sense of immersion. A soft material is preferably used for the cushion 955 so that the cushion 955 is in close contact with the user's face when the user wears the electronic device 950. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 955, whereby light leakage can be suitably prevented. Furthermore, using such a material is preferable because it has a soft texture and the user does not feel cold when wearing the device in a cold season, for example. The member in contact with user's skin, such as the cushion 955 or the mounting portion 954, is preferably detachable, in which case cleaning or replacement can be easily performed.

At least part of this embodiment can be implemented in combination with the other embodiments described in this specification as appropriate.

Embodiment 7

In this embodiment, an example of an electronic device that can be used as the data processing device or the display device of one embodiment of the present invention will be described.

Figure 19A:
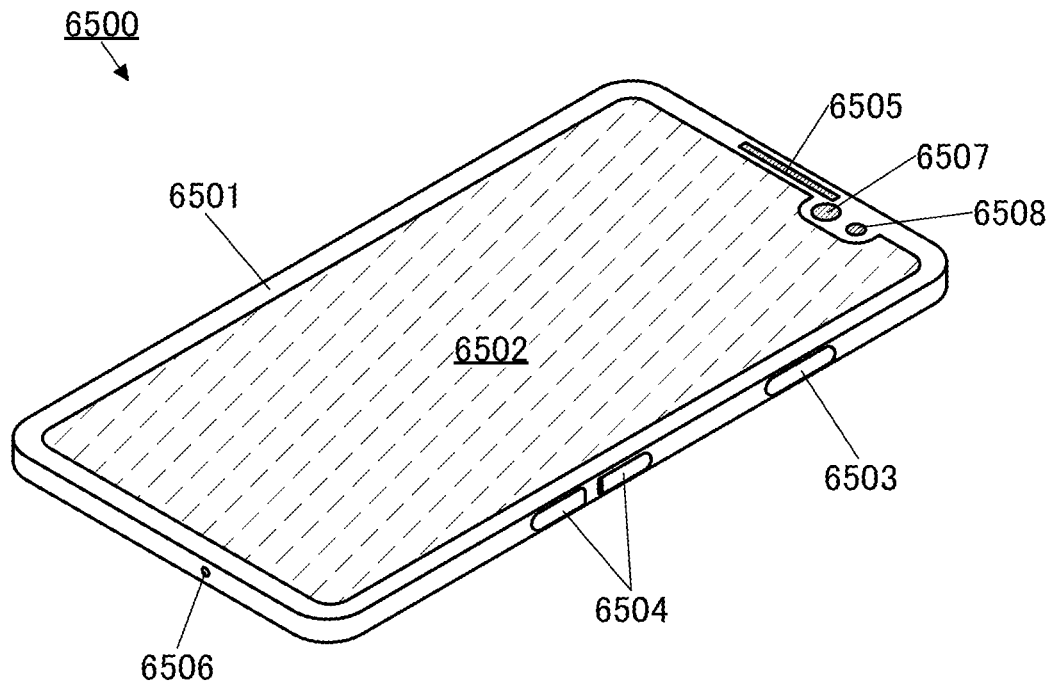
FIG. 19(A) and FIG. 19(B) are diagrams illustrating a structure example of an electronic device.

An electronic device 6500 illustrated in FIG. 19(A) is a portable information terminal that can be used as a smartphone.

The electronic device 6500 includes a housing 6501, a display unit 6502, a power button 6503, buttons 6504, a speaker 6505, a microphone 6506, a camera 6507, a light source 6508, and the like. The display unit 6502 has a touch panel function. The electronic device 6500 includes an arithmetic device, a memory device, and the like inside the housing 6501.

An image of part of the user's face can be captured with the camera 6507. At this time, the light source 6508 that can emit not only visible light but also infrared rays enables data on the face to be obtained more accurately without making the user feel the glare.

Figure 19B:
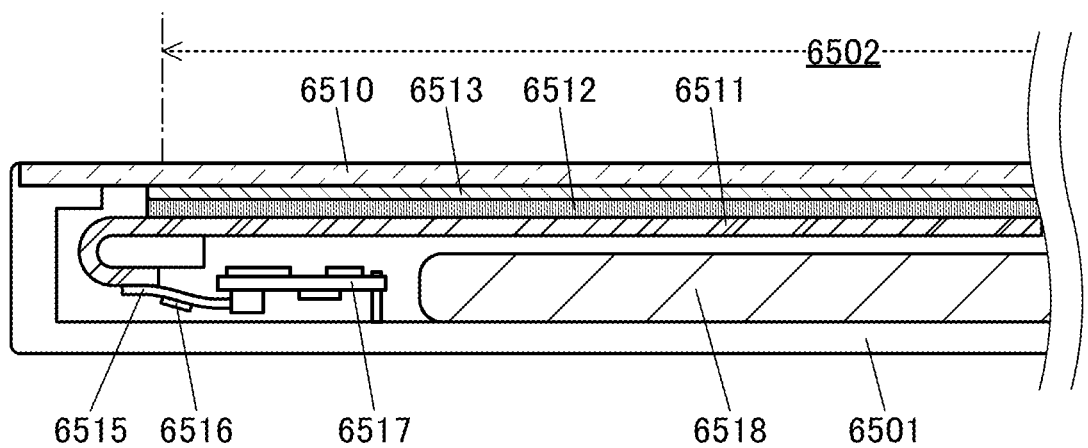

FIG. 19(B) is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display unit 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

REFERENCE NUMERALS

10: data processing device, 11: data presentation unit, 12: subject detection unit, 13: feature extraction unit, 14: emotion estimation unit, 15: data generation unit, 20: image display device, 21: image display unit, 25: image generation unit, 30: diagonal, 51: input layer, 52: intermediate layer, 53: output layer, 61: data, 62: data, 63: data, 71: image data, 72: image data, 73: image data, 100: data processing device, 101: arithmetic unit, 102: arithmetic unit, 103: memory module, 104: display module, 105: sensor module, 106: sound module, 107: vibration module, 108: lighting module, 109: fragrance module, 110: bus line, 111: communication module, 112: battery module, 113: camera module, 114: external interface

The invention claimed is:

1. An image display device comprising:
   an image display unit comprising a light-emitting element; and
   a subject detection unit comprising a sensor element,
   wherein the light-emitting element comprises a first conductive layer, an EL layer over the first conductive layer, and a third conductive layer over the EL layer,
   wherein the sensor element comprises a second conductive layer, an active layer over the second conductive layer, and the third conductive layer over the active layer, and
   wherein both the first conductive layer and the second conductive layer are provided over and in contact with an insulating layer.

2. An image display device comprising:
   an image display unit comprising a light-emitting element;
   a subject detection unit comprising a sensor element;
   a first insulating layer over the light-emitting element and the sensor element; and a coloring layer overlapping with the light-emitting element with the first insulating layer therebetween, wherein the light-emitting element comprises a first conductive layer, an EL layer over the first conductive layer, and a third conductive layer over the EL layer, wherein the sensor element comprises a second conductive layer, an active layer over the second conductive layer, and the third conductive layer over the active layer, and wherein both the first conductive layer and the second conductive layer are provided over and in contact with a second insulating layer.

3. The image display device according to claim 2, further comprising:

a filter for blocking part of light entering the sensor element, wherein the filter overlaps with the sensor element with the first insulating layer therebetween.

4. The image display device according to claim 3, wherein both the coloring layer and the filter are provided over and in contact with the first insulating layer.

* * * * *